United States Patent [19]

Horikiri et al.

[11] Patent Number: 5,084,728
[45] Date of Patent: Jan. 28, 1992

[54] IMAGE RECORDING APPARATUS AND PACKING CASE FOR IMAGE RECORDING SHEETS TO BE USED FOR IMAGE RECORDING APPARATUS

[75] Inventors: Keiichi Horikiri; Haruki Nakamura; Michiyasu Onda, all of Tokyo, Japan

[73] Assignee: Seiko Instruments Inc., Japan

[21] Appl. No.: 375,857

[22] Filed: Jul. 5, 1989

[30] Foreign Application Priority Data

| Jul. 5, 1988 | [JP] | Japan | 63-89596[U] |
| Apr. 27, 1989 | [JP] | Japan | 1-49936[U] |
| Apr. 27, 1989 | [JP] | Japan | 1-49937[U] |
| Apr. 27, 1989 | [JP] | Japan | 1-49938[U] |
| Apr. 27, 1989 | [JP] | Japan | 1-49939[U] |
| Apr. 27, 1989 | [JP] | Japan | 1-49942[U] |
| Apr. 27, 1989 | [JP] | Japan | 1-49944[U] |

[51] Int. Cl.$^5$ .............................. G03B 27/58
[52] U.S. Cl. ............................. 355/72; 354/277
[58] Field of Search .................. 355/72, 27, 28; 430/128; 354/174, 277, 276, 283; 271/145, 162–164, 167, 171, 3.1, 121, 258, 262, 265

[56] References Cited

U.S. PATENT DOCUMENTS

| 3,907,283 | 9/1975 | Miller | 271/258 |
| 4,388,992 | 6/1983 | Deconinck | 354/276 |
| 4,488,718 | 12/1984 | Tamura | 271/162 |
| 4,783,683 | 11/1988 | Nagumo et al. | 355/27 |
| 4,860,042 | 8/1989 | Tajima et al. | 354/277 |

FOREIGN PATENT DOCUMENTS

| 0203016 | 11/1984 | Japan | 271/162 |
| 0211244 | 9/1986 | Japan | 271/145 |
| 0259931 | 11/1987 | Japan | 271/145 |
| 0087431 | 3/1989 | Japan | 271/171 |

Primary Examiner—Brian W. Brown
Assistant Examiner—Khanh Dang
Attorney, Agent, or Firm—Bruce L. Adams; Van C. Wilks

[57] ABSTRACT

Novel packing cases for image forming sheets are invented. An image forming machine, such as a color hard copying machine uses image forming sheets which are coated on their surfaces with image forming material. Since the image forming material easily comes off from the surface of an image forming sheet, the surface must be protected from physical contacts, particularly during transportation, handling, storing, etc. The novel packing cases are not only provided with protective sheets to protect image forming sheets accommodated in the packing case, but also with other inventive features to avoid any possible physical contacts with the surface of the image recording sheet.

8 Claims, 22 Drawing Sheets

| SENSOR | SHEET SIZE | | | | | |
|---|---|---|---|---|---|---|
| | A3 | A4 | A5 | B3 | B4 | |
| 31A | ○ | × | × | × | ○ | |
| 31B | × | ○ | × | ○ | × | |
| 31C | × | × | ○ | ○ | ○ | |

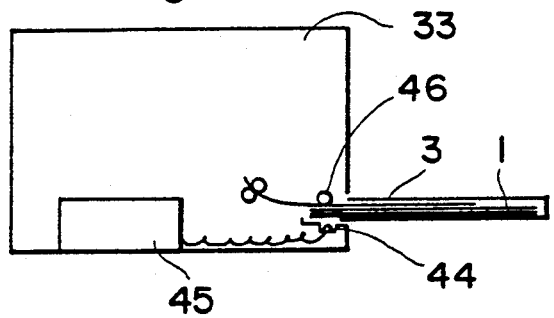
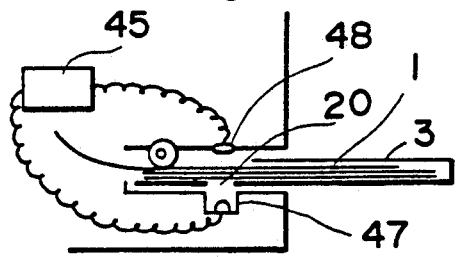
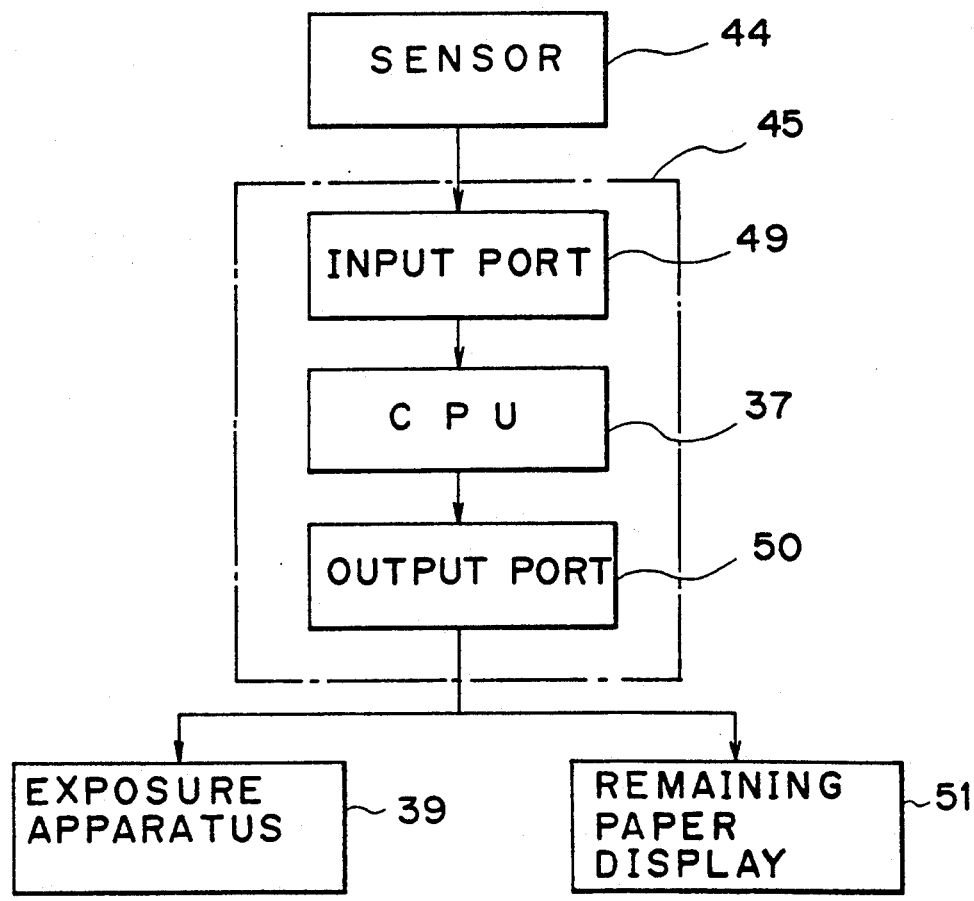

Fig. 45
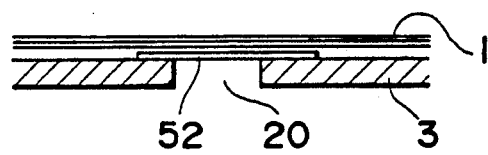
Fig. 46A
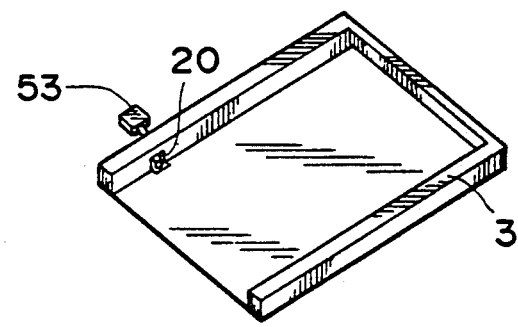
Fig. 46B       Fig. 46C
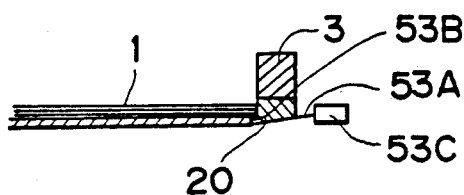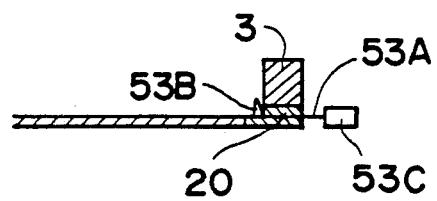
Fig. 47
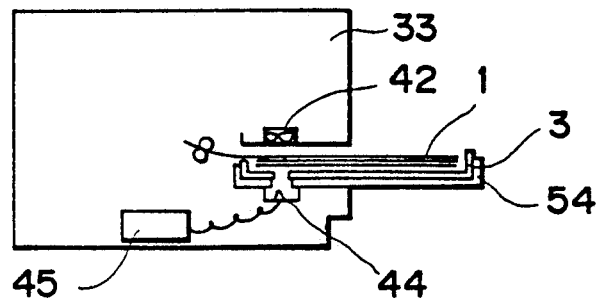

Fig. 51
PRIOR ART
Fig. 51A
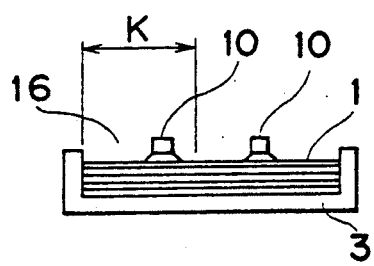
Fig. 51B
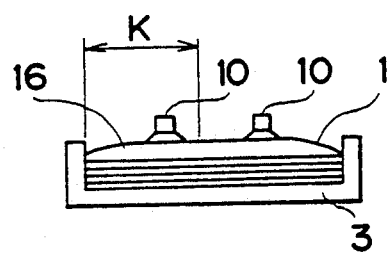
Fig. 51C
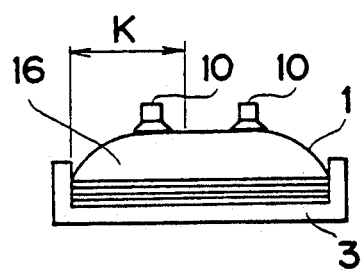
Fig. 51D
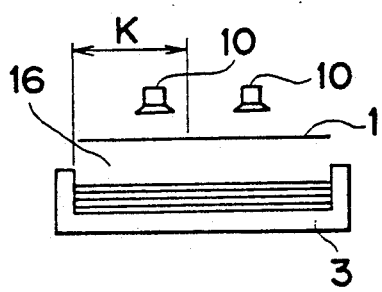
Fig. 51E
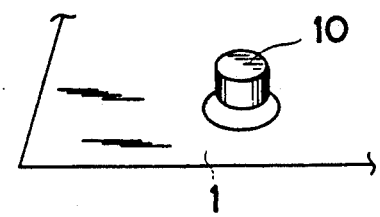
Fig. 51F
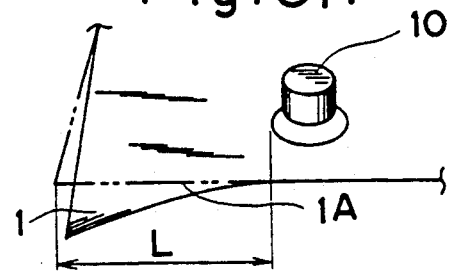
Fig. 51G
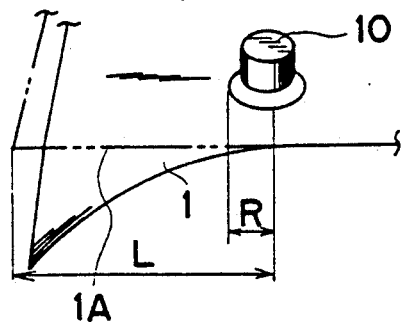
Fig. 51H
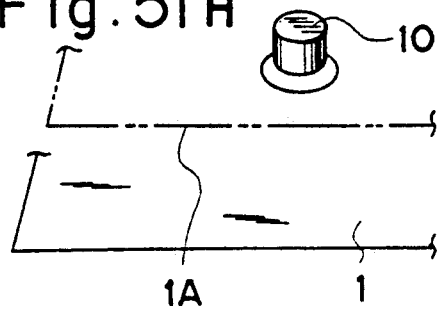

IMAGE RECORDING APPARATUS AND PACKING CASE FOR IMAGE RECORDING SHEETS TO BE USED FOR IMAGE RECORDING APPARATUS

BACKGROUND OF THE INVENTION

The present invention relates to an image recording apparatus, and more particularly to a packing case for image recording sheets which are used in an image recording apparatus, such as a color hard copy machine.

U.S. Pat. Nos. 4,399,209 and 4,440,846 and U.K. Pat. No. GB 2,223,860 to Mead Corporation describe an imaging system. According to this system, a photosensitive layer comprising microcapsules containing a photosensitive composition in the internal phase is image-wise exposed to actinic radiation and subjected to a uniform rupturing force, whereby the microcapsules rupture and image-wise release the internal phase. An image-forming agent such as a substantially colorless chromogenic material is coated on an image recording sheet and is typically associated with the microcapsules such that when the microcapsules rupture, the chromogenic material is able to image-wise react with a developer material and produce a color image. Since this printing system can produce pixels in the same size as the size of a microcapsule, that is on the order of $\mu m$, a color image is printed with extremely high resolution.

There are roughly two types of image recording sheets in terms of their storage and feeding systems. One is provided in a roll such as disclosed in the above U.S. patents. The other is provided in cut sheets. The cut sheet feed system is disclosed in, for example, EP 255,138A. Cut image recording sheets are generally provided in a large container box. Therefore when cut image recording sheets are set at a feeding station or feeding tray of an image recording apparatus, a required amount of cut image recording sheets is taken out from the large container box and thereafter set in the feeding station by hand.

This manual operation causes basically two problems. A front surface of a cut image recording sheet is coated with an image-forming agent, and therefore manual handling of the cut image recording sheets may likely damage the image-forming agent coated surface of the image recording sheet since the image-forming agent easily comes off from the surface of the sheet. Furthermore, even though the front surface of the image recording sheet is coated with an image-forming agent, the coating of the image-forming agent is not visibly discernible, and therefore the front surface of the sheet coated with the image-forming agent is easily mistaken for its rear surface.

Secondly, a conventional feeding tray 60 is shown in FIG. 50. A required amount of image-forming sheets is set into the feeding tray 60 before the feeding tray 60 is fitted into an image-forming apparatus, such as a color hard copy machine. Conventionally, such feeding tray has brushes on the inner surfaces thereof in order to prevent simultaneously feeding of the multiple image-forming sheets (hereafter referred to as double feeding). However, in case of the use of image recording sheets, such brushes are not preferable because bristles of the brushes scrape off the image-forming agent coated on the surface of the image-forming sheet.

A well known image-forming apparatus has an image recording sheet feeder such as schematically shown in FIG. 10A and FIG. 10B. When this image-forming apparatus adopts a conventional feeding tray such as shown in FIG. 50, another problem in addition to the problems described above occurs. The image recording sheet feeder basically uses sucking force of suckers for attracting an image recording sheet. The attracted image recording sheet is then fed in the image-forming apparatus. FIGS. 51(A) to 51(D) schematically show the operation of feeding an image recording sheet 1 by suckers 10. FIGS. 51(E) to 51(H) are perspective views showing successively the operation of feeding the image recording sheet 1 by the suckers 10. FIG. 51(A) shows a state, in which the image recording sheet 1 stored in a feeding tray 3 has its surface sucked by two suckers 10. FIG. 51(E) is a perspective view showing the sucked state of the image recording sheet 1 by the suckers 10 within a range of a portion K shown in FIG. 51(A). When the suckers 10 are slightly raised from the position shown in FIG. 51(A), the image recording sheet 1 has its peripheral portion caught by the inner walls of the feeding tray 3 due to the friction between the periphery of the image recording sheet 1 and the inner walls of the feeding tray 3 because the image recording sheet 1 and the shape of the storage space of the feeding tray 3 have substantially the same shape. As a result, the peripheral edge portion of the image recording sheet 1 does not rise as compared with the inner area of the image-recording sheet as shown in FIG. 51(B) which results in a curve L around the peripheral portion of the image recording sheet as shown in FIG. 51(F). When the suckers 10 are raised to a height shown in FIG. 51(C), the curve L extends to a position under the suckers 10 as shown in FIG. 51(G) and the attracting force between the suckers 10 and the image recording sheet is consequently reduced. When the suckers 10 are further raised, the attracting force between the image recording sheet 1 and the suckers 10 is lost, and consequently the image recording sheet drops back into the feeding tray 3 as shown in FIGS. 51(D) and 51(H). In particular, when the humidity around the image-recording sheet 1 is high, the image-forming agent coated on the image recording sheet increases its resistance, whereby the problem accompanying this sheet feeder as described above worsens.

Thirdly, in sheet prior art, the detection is performed by providing a detection unit in a sheet conveyor path inside of the image-recording apparatus. This art repeats purposeless operations of feeding the sheets to the inside of the image recording apparatus until the detection unit judges the exhaust of the sheets despite the fact that the sheets have already been exhausted. In order to prevent such purposeless operations, it has been conceived to provide in the case a mechanism for raising the sheets so that the existence of the sheets may be determined by a touch sensor. For example, FIG. 52 is a schematic section showing a paper feed unit of the prior art. Sheets 61 are packed in a feeding tray 60 which is arrange therein with a pop-up plate 62, and this plate 62 is popped up by the extension of a spring 63. Over the surface of the feeding tray 60, there is arranged a roller 64 which is made of silicon rubber for conveying the sheets 61 into an image-recording apparatus 66. At the end of the sheet 61, there is arranged a touch sensor 65 for detecting the existence of the sheets 61. The touch sensor 65 has its two ends 65B and 65C pivotal on a fulcrum 65A so that when all the sheets 61 are conveyed out from the feeding tray 60, a detection unit 65D comes into contact with the end 65C to inform the image-recording apparatus 66 itself or its user of the exhaustion of the sheets 61. Thus, the image-recording apparatus of the prior art can not recognize the exhaustion of the image recording sheets, and continues its feeding and printing operations without image recording sheets. Such operation may damage components provided within the image-recording apparatus such as suckers, pressure rollers, etc.

Fourthly, an image-recording apparatus of the prior art has a feeding station whose width is manually adjusted for accommodating image recording sheets of different sizes. The change of sheet size is detected with a sheet-size detection unit provided within the image-recording apparatus, and the pressure of the pressure rollers is adjusted according to the detected change in size of the image-recording sheet. Therefore there is likelihood of wrong feeding of an image-recording sheet of a size inappropriate for a manually set sheet size. When an inappropriate sheet is fed, components such as pressure rollers provided within the image-recording apparatus may be damaged due to improper roller pressure for a fed image recording sheet.

SUMMARY OF THE INVENTION

An object of the present invention is therefore to solve the foregoing problems accompanying an image recording sheet feeding mechanism of an image-forming apparatus such as a color hard copying machine. Another object of the invention is to provide a packing case for accommodating image recording sheets and which has a protective sheet for protecting the image-forming agent coated on the image recording sheets. Still another object of the invention is to provide a packing case having means to prevent double feeding of image-recording sheets and which is not structurally harmful to the image-forming agent coated on the image-forming sheets. A further object of the present invention is to provide a packing case having therein a storage area for accommodating image recording sheets and which facilitates feeding of the image recording sheets. Still a further object of the invention contemplates the provision to a packing case of means for recognizing the existence of image recording sheets within the packing case. An additional object of the present invention is to provide a packing case with means to indicate a size of the image recording sheets which enable an image recording sheet feeding mechanism to recognize the size of the image recording sheets.

BRIEF DESCRIPTION OF DRAWINGS

FIG. 42 is a schematic view of a first example of a feeding mechanism accommodating a packing case having a sheet recognition hole provided therein;

FIG. 43 is a schematic view of a second example of a feeding mechanism accommodating a packing case having a sheet recognition hole provided therein;

FIG. 44 is a schematic operation diagram of an image recording sheet recognition unit;

FIG. 45 is an enlarged cross section of a sheet recognition hole;

FIG. 46A is a perspective view of a packing case having a sheet recognition hole;

FIG. 46B schematically shows a sensor position when sheets remain;

FIG. 46C schematically shows a sensor position when sheets are exhausted;

FIG. 47 schematically shows a feeding mechanism accommodating a packing case having sheet and sheet size recognition holes;

FIGS. 51A to 51H schematically successively illustrate the operation of feeding image recording sheets according to the prior art;

FIG. 53 is a block diagram of a portion of an image recording apparatus.

DETAIL DESCRIPTION OF PREFERRED EMBODIMENTS

Protective Sheet

Figure 1:
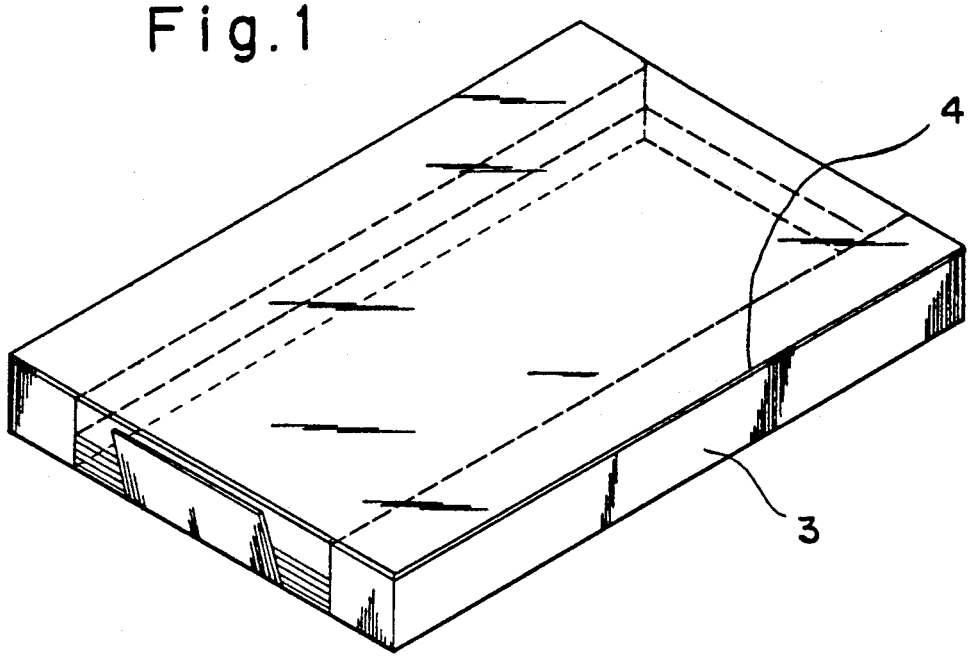
FIG. 1 is a perspective view of a first embodiment of packing case with a protective sheet covering the surface of image recording sheets coated with image-forming agent.
Figure 2:
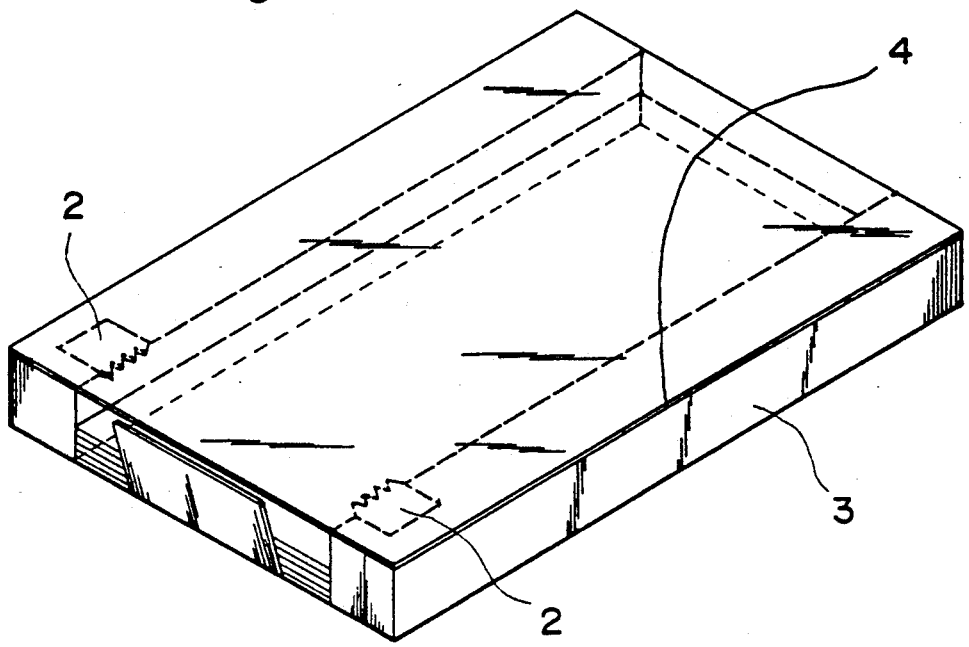
FIG. 2 is a perspective view of a packing case with a protective sheet and a first embodiment of double feed preventing pawls.

FIG. 1 is a perspective view showing a packing case according to a first embodiment of the present invention. A packing case 3 for accommodating image recording sheets 1 coated with an image forming agent has an upper surface of its storage portion covered with a protective sheet 4 for protecting the image-forming agent over the image recording sheets 1. The protective sheet 4 can be peeled off from the packing case 3. On the other hand, as shown in FIG. 2, the packing case 3 may be equipped with members 2 for preventing double feeding of the image sheets.

Figure 7:
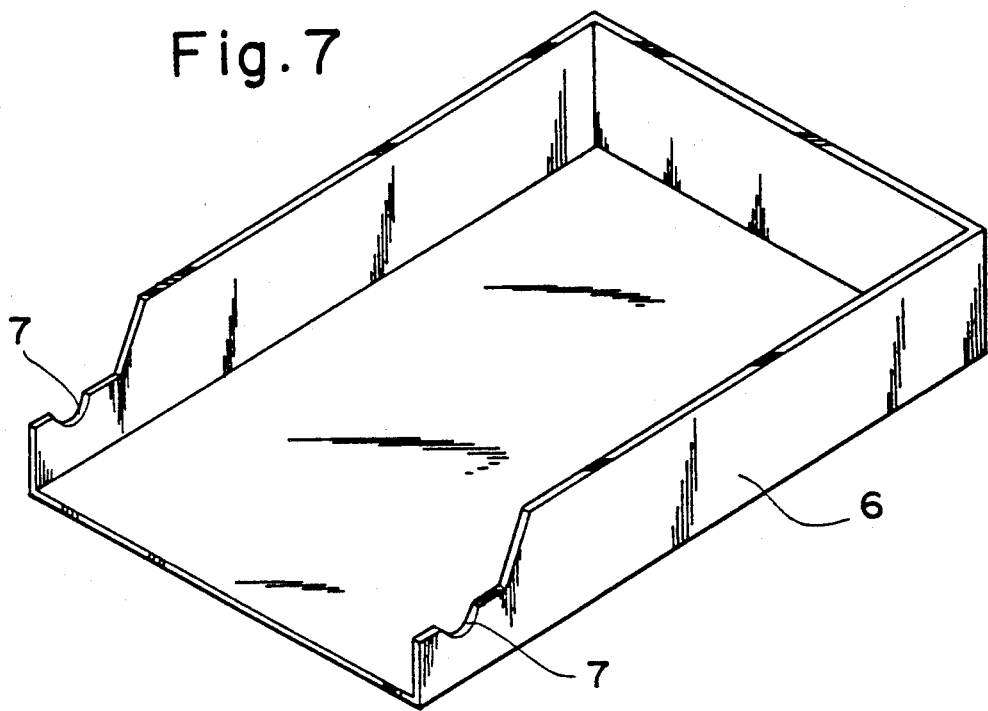
FIG. 7 is a perspective view of one example of an image recording sheet feeding tray.

FIG. 7 is a perspective view showing a paper feed tray 6 for receiving therein the packing case 3 and for feeding the image recording sheets 1 into the image-recording apparatus. The paper feed tray 6 is formed with tapered portions 7.

Next will be described a method of feeding the image-recording sheets by using the aforementioned packing case 3. The packing case disclosed in the following embodiments has been particularly invented to be used in an image recording apparatus such as briefly described in the above background of the invention. Such image recording apparatus, as shown in block form in FIG. 53, is basically comprised of feeding means for feeding an image recording sheet into the image forming apparatus; illuminating means for illuminating an original image or information; and exposure means for exposing the image recording sheet to light representative of the original image or information.

First, when the image recording sheets 1 in the packing case 3 are exhausted, the paper feed tray 6 accommodating the packing case 3 is removed from the image recording apparatus. Then, the empty packing caes 3 is taken out from the paper feed tray 6.

Figure 8:
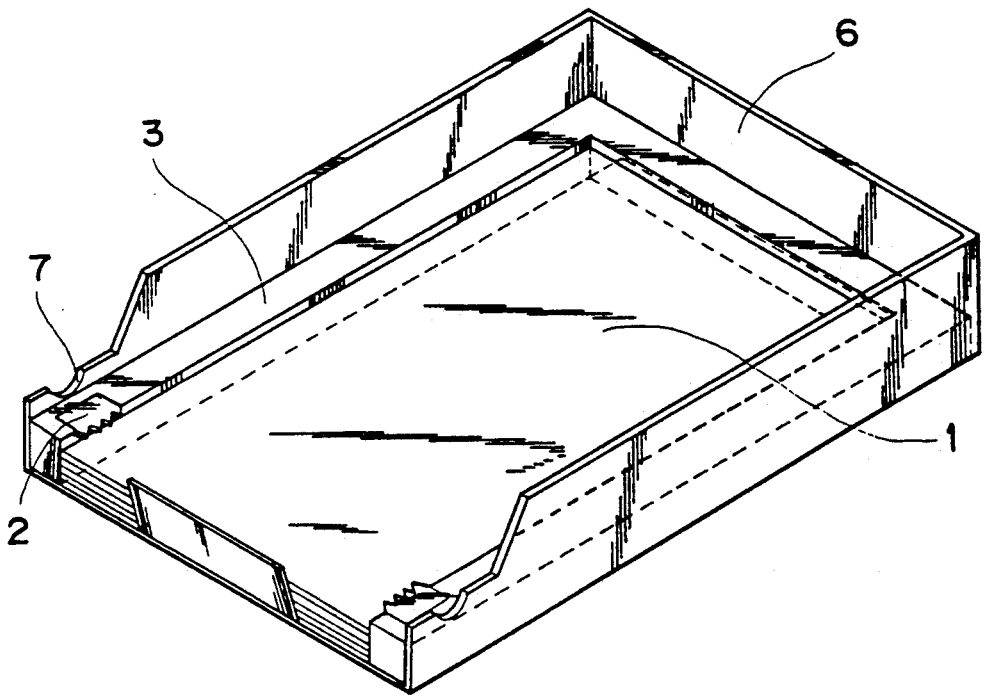
FIG. 8 is a perspective view of an image recording sheet feeding tray with a packing case containing image recording sheets set therein.
Figure 9:
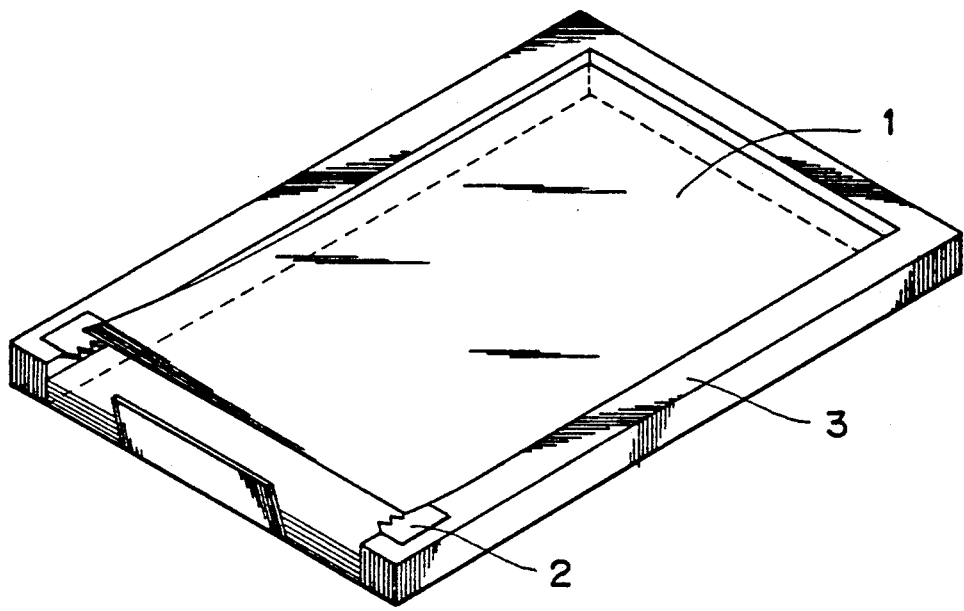
FIG. 9 is a perspective view of a packing case in use.

After this, as shown in FIG. 8, a new packing case 3 accommodating the image recording sheets 1 is fitted in the paper feed tray 6. The packing case 3 has its protective sheet 4 peeled off, before it is fitted in the paper feed tray 6, so that the image recording sheets 1 can be fed into the image-recording apparatus, as shown in FIG. 9.

Next, the feed of the image recording sheets 1 to the image-recording apparatus will be described in the case of using the packing case 3 and paper feed tray 6.

Figure 10A:
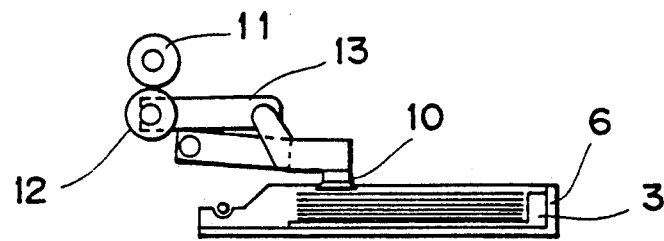
FIGS. 10A and 10B schematically show a packing case in feeding operation.
Figure 10B:
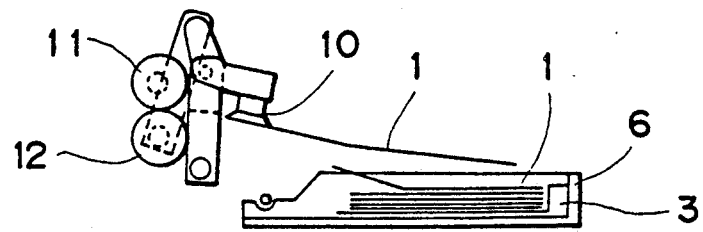

FIGS. 10A and 10B are schematic views showing the paper feeding operations using the packing case 3 of the present device. The image recording sheets 1 are accommodated in the packing case 3, which in turn is fitted in the paper feed tray 6. This paper feed tray 6 is removably mounted in the image recording apparatus. The image recording sheets 1 are fed into the image-recording apparatus by the paper feed device, which is composed of paper feed rollers 11 and 12 for conveying the image recording sheets 1 to the inside of the image-recording apparatus; a link mechanism 13 associated with the paper feed roller 11; and suckers 10 carried by the link mechanism 13 for sucking the image recording sheets 1.

Next, the operations will be described in the following. First, as shown in FIG. 10A, the suckers 10 carried by the link mechanism 13 are forced into contact with the surface of the image recording sheet 1 as the paper feed roller 12 rotates to enable the suckers 10 to hold the sheet 10 by suction. After this, as shown in FIG. 10B, the suckers 10 having sucked the image recording sheet 1 are raised according to a rotation of the paper feed roller 12 to transfer the image recording sheet 1 to the paper feed rollers 11 and 12. As the paper feed rollers 11 and 12 rotate, the image recording sheet 1 is fed into the image-recording apparatus.

The protective sheet 4 covering the upper surface of the packing case 3 need not be removed from the whole surface area. For example, the protective sheet 4 may be made peelable from the packing case 3 only at a predetermined portion of the upper surface of the packing case 3 at the side of the paper feed device, but the remaining portion of the protective sheet 4 is fixed to the packing case 3 by means of adhesion or fusion. When the packing case 3 is used, the protective sheet 4 is peeled off only at its peelable portion, and its peeled portion may be folded to the remaining portion fixed to the packing case 3. Moreover, if the peelable portion of the protective sheet 4 is made to repeatedly be peeled and sealed by using a suitable glue, the once peeled portion can be sealed again. Then, the protective sheet 4 can protect again the image recording sheets 1 when the packing case 3 is taken out from the image-recording apparatus before the image recording sheets 1 are completely exhausted.

Figure 11:
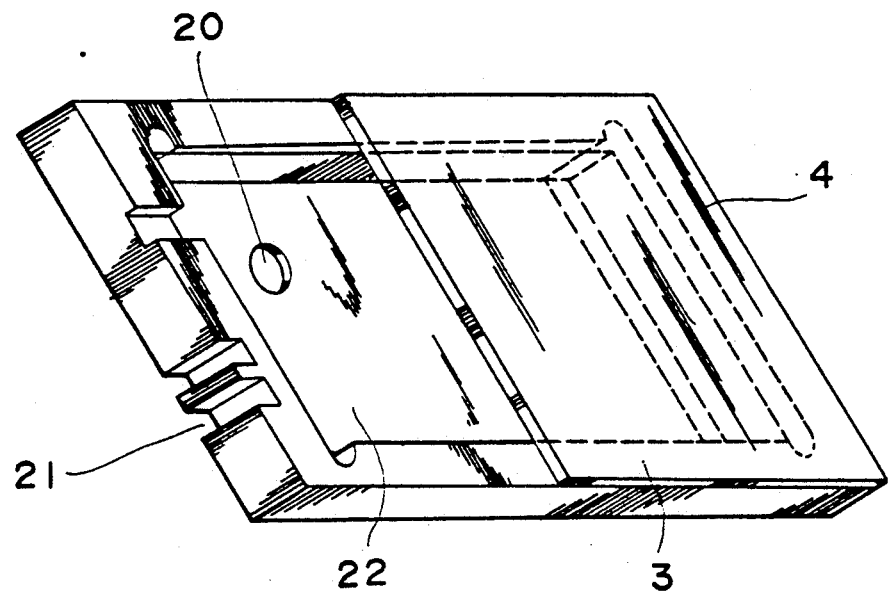
FIG. 11 is a perspective view of a second embodiment of a packing case having a top cover of a first size.
Figure 12:
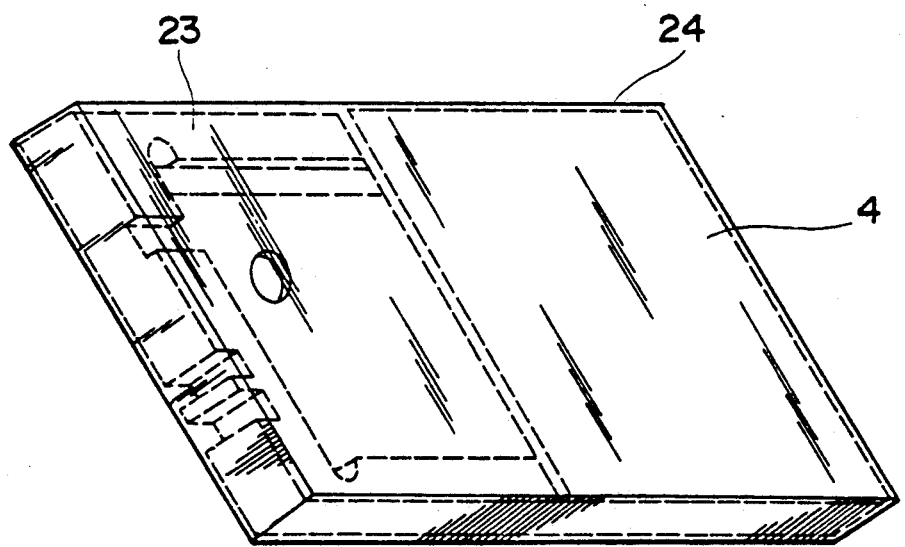
FIG. 12 is a perspective view of the second embodiment covered with a protective sheet of a first type.

FIGS. 11 to 15B are perspective views showing packing cases of a second embodiment of the present invention. FIG. 11 is a perspective view showing a packing case 3, the storage portion of which has its upper surface covered by about one half with a protective cover 4. This protective cover 4 is made of paper, fabric, synthetic resins or metallic material, and is glued or fused to the packing case 3. Double-dotted lines appearing in the figure indicate an imaginary state of which the image recording sheets 1 are accommodated in the storage portion of the packing case 3. The packing case 3 as shown in FIG. 11 may be covered all over its surfaces with an overall protective sheet 24 as shown in FIG. 12. Before the packing case 3 is set in the image-recording apparatus, the overall protective sheet 24 is removed and the image recording sheets are exposed for sheet feeding operation as shown in FIG. 11.

Figure 13:
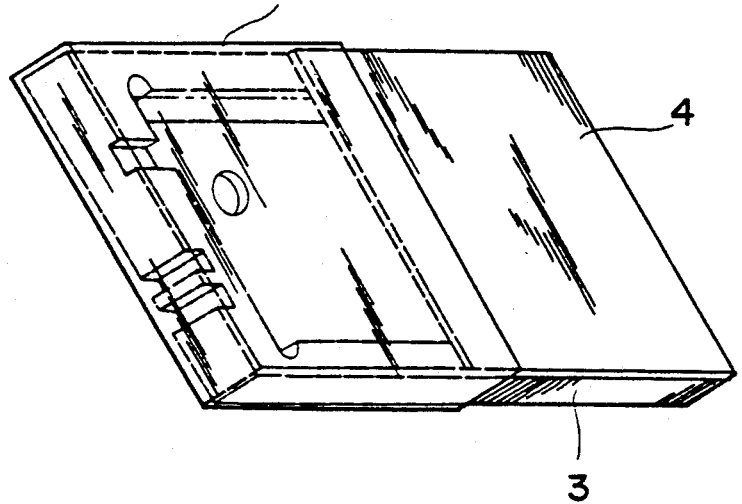
FIG. 13 is a perspective view of the second embodiment covered with a protective sheet of a second type.
Figure 14:
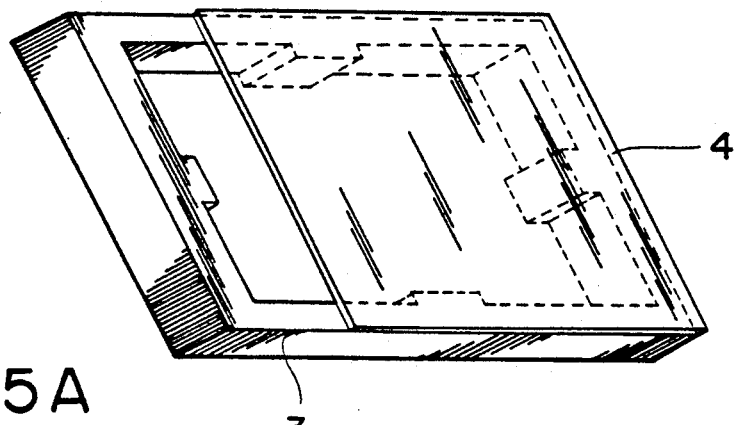
FIG. 14 is a perspective view of the second embodiment having a top cover of a second size.
Figure 15A:
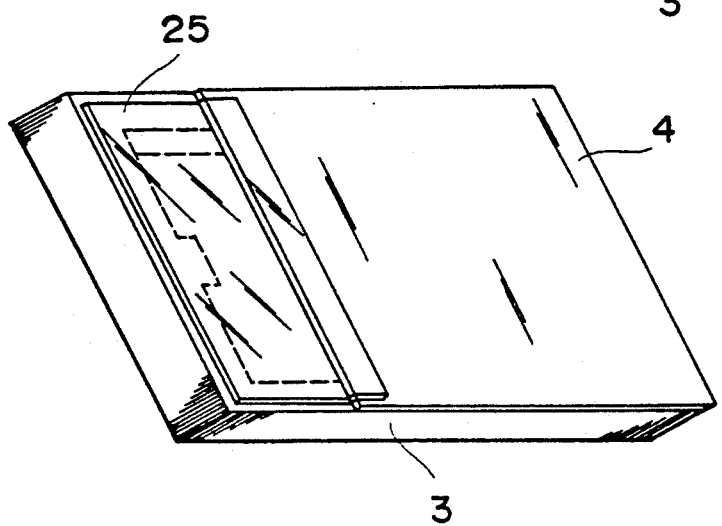
FIGS. 15A and 15B show the second embodiment having a top cover of the second size in which the opening is covered by a protective sheet.

Of course the packing case 3 may not have to be covered all over its surfaces. For example, a partial protective sheet 25 covering only the opening in the packing case 3 is sufficient to protect the image-recording sheets 1 as shown in FIG. 13. FIG. 14 is a perspective view showing a packing case 3 with its top surface covered by a protective cover 4 except for a minimum opening necessary for the paper feed mechanism to feed the image recording sheets 1. FIG. 15A shows a state in which an opening protection sheet 25 is arranged to cover only the opening formed in the upper surface of the storage portion of the packing case 3 of FIG. 14.

Figure 15B:
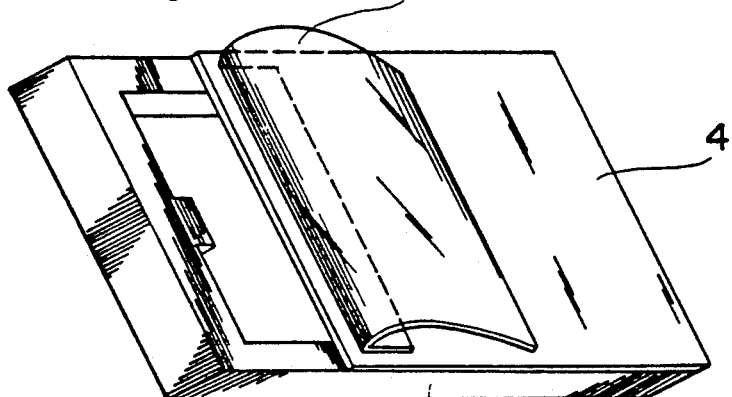

This opening protection sheet 25 may be completely removed or may be peeled until the opening is sufficiently uncovered for feeding operation. In case of the latter, as shown in FIG. 15B, the peeled portion of the opening protection sheet 25 is pulled backward while the packing case 3 containing the image recording sheets 1 is set in the image recording apparatus. By providing an appropriate adhesive between the opening protection sheet 25 and the packing case 3, the opening may be re-sealed when the packing case 3 is removed from the image-recording apparatus before all the image recording sheets 1 are exhausted.

Figure 16A:
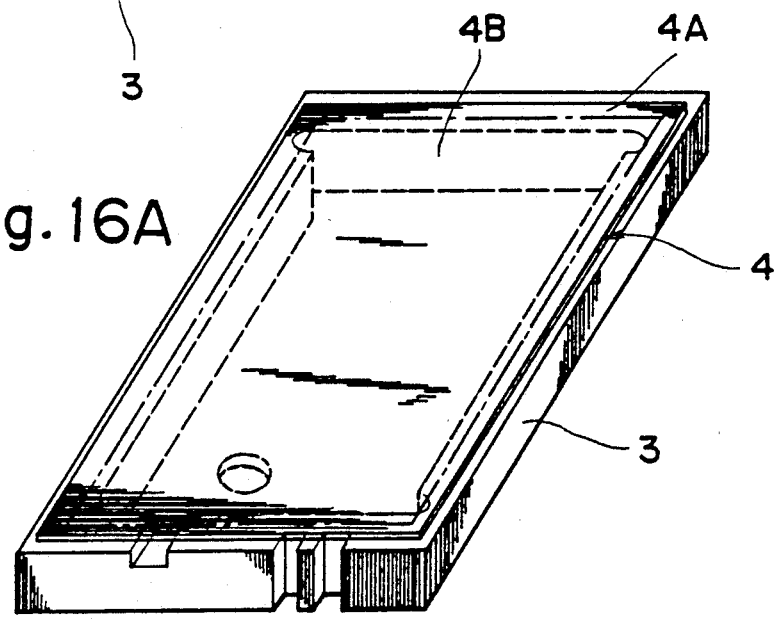
FIGS. 16A, 16B and 16C are perspective views of packing cases covered by various types of protective sheets.
Figure 16B:
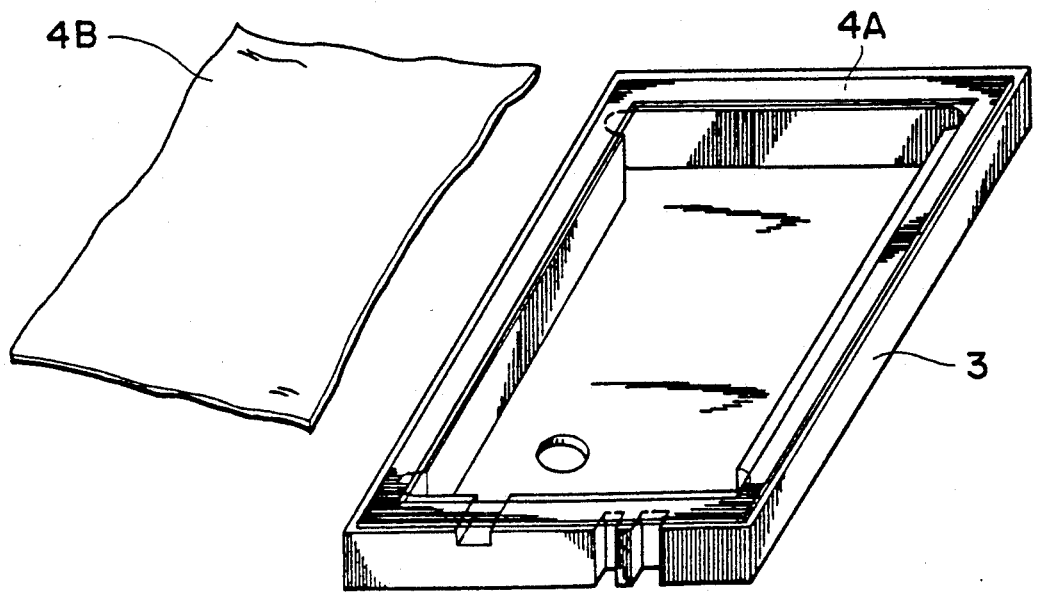
Figure 16C:
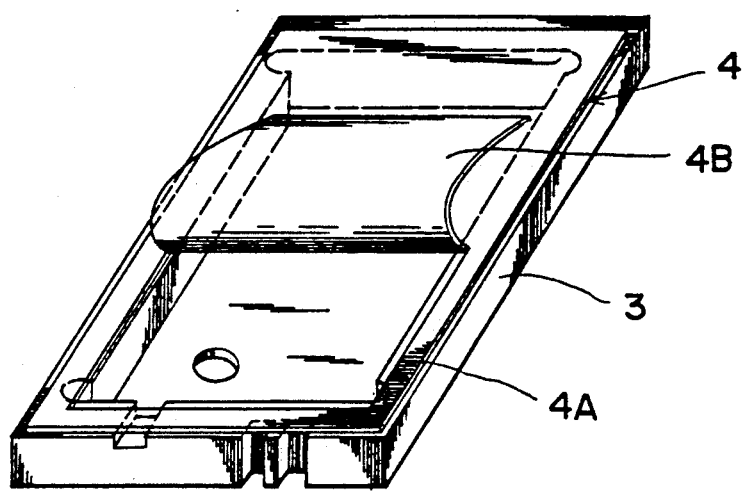

FIG. 16A shows an embodiment in which a protective sheet 4 is arranged to cover the upper surface of the packing case 3 accommodating image recording sheets 1. The protective sheet 4 is provided with separation means such as perforations or separating tapes for separating a sheet fixing portion 4A and a sheet peeling portion 4B along single-dotted lines. By gluing or fusing the sheet fixing portion 4A to the packing case 3, the protective sheet 4 is arranged to cover the upper surface of the upper surface of the storage portion of the packing case 3. When the packing case 3 is set in the image-recording apparatus, the sheet peeling portion 4B is separated from the sheet fixing portion 4A so that the image-recording sheets 1 are exposed for feeding operation, the state of which is shown in FIG. 16B. Alternatively, the aforementioned separation means may be disposed only at a part of the periphery around the storage portion of the packing case 3. Such a packing case is perspectively shown in FIG. 16C. When the packing case 3 is set in the image-recording apparatus, a sheet peeling portion 4B is removed from a sheet fixing portion 4A of a protective sheet 4 only at a part of the periphery around the storage portion of the packing case 3. It is no doubt possible to provide separation means of this type to the aforementioned opening protection sheets of the packing cases of the second embodiment. The protective sheet 4 described in the foregoing not only protects the image-forming agent coated over the image forming sheets from physical damage but also maintains a constant moisture level inside the packing case so that an optimum quality of the image-forming sheets enclosed in the packing case is secured.

Figure 17:
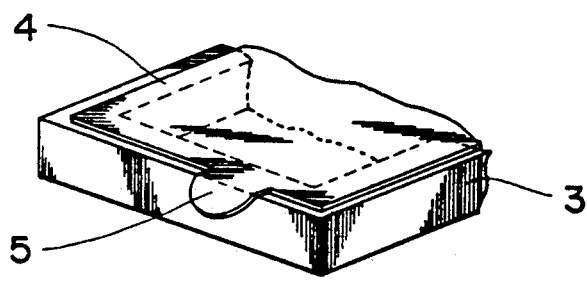
FIGS. 17 and 18 show perspective sheets having flaps for the aid of peeling off thereof.
Figure 18:
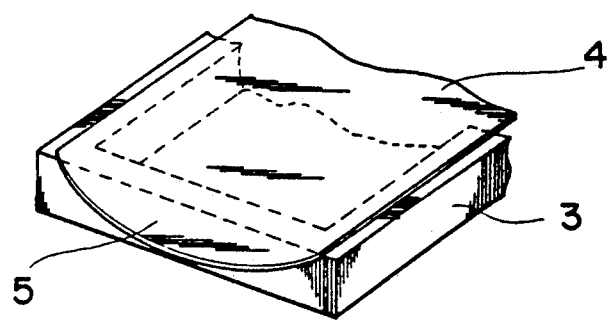

FIGS. 17 and 18 are perspective view showing essential portions of a protective sheet 4 or an opening protection sheet 25.

As shown in FIG. 17, a protective sheet 4 to be peeled from a packing case 3 is provided with an ear or a flap 5 protruding from a portion of one side of the packing case 3. As shown in FIG. 18, on the other hand, a protective sheet 4 to be peeled from a packing case 3 is provided with a peeling aid flap 5 which protrudes from the whole length of one side of he packing case 3.

Thus, by forming the peeling aid flap 5 at the protective sheet or the opening protection sheet such that it extends from the packing case, the protective sheet and the opening protection sheet can be easily peeled from the packing case.

Figure 19:
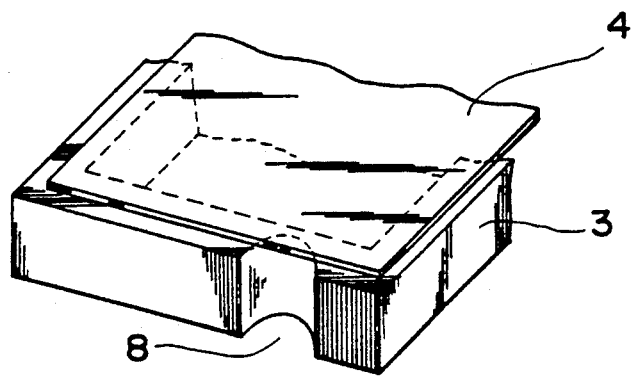
FIGS. 19, 20 and 21 show packing cases having recesses for the aid of peeling off their protective sheets.
Figure 20:
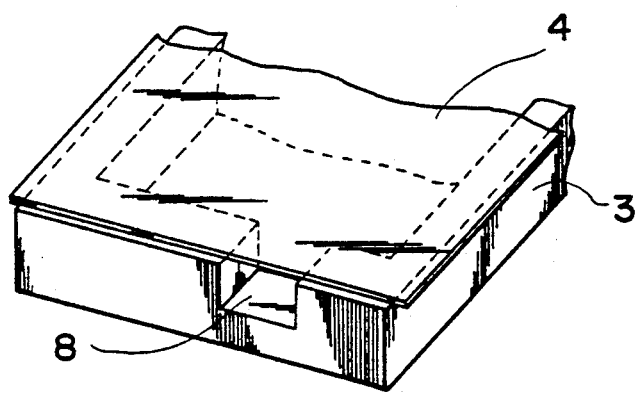
Figure 21:
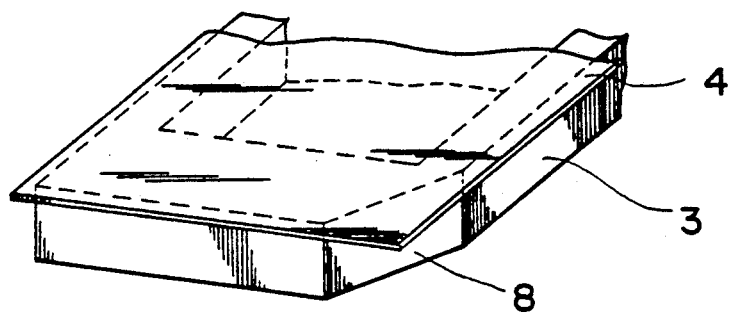

FIGS. 19, 20 and 21 are perspective views showing parts of packing cases provided with recesses for helping the removal of a protective sheet and an opening protection sheet from a packing case. As shown in FIG. 19, a packing case 3 is formed in its one side with a semicircular peel aiding recess 8 for helping the removal of a protective sheet or an opening protection sheet 4. Referring to FIG. 20, a packing case 3 is formed in its one side with a square peel aiding recess 8 for helping the removal of a protective sheet or an opening protection sheet 4. As shown in FIG. 21, a packing case 3 is formed at its one end corner with a peel aiding chamber 8 for helping the removal of a protective sheet or an opening protection sheet 4. By providing a peel aiding recess 8 in a packing case 3, a protective sheet 4 or an opening protection sheet 25 can easily be peeled from the packing case.

Figure 22:
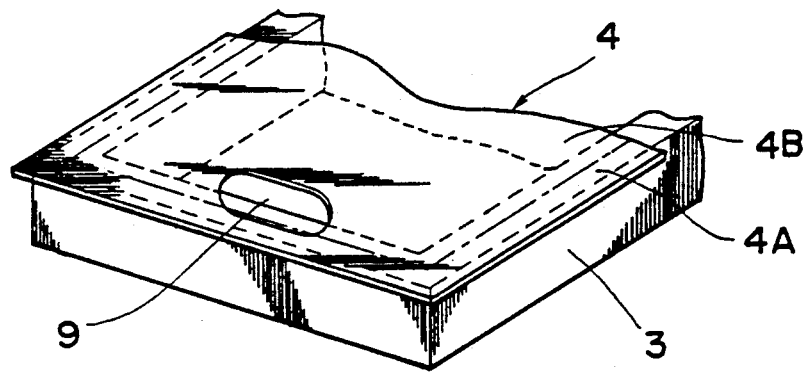
FIGS. 22, 23 and 24 show protective sheets having various cuts for the aid of peeling off thereof.
Figure 23:
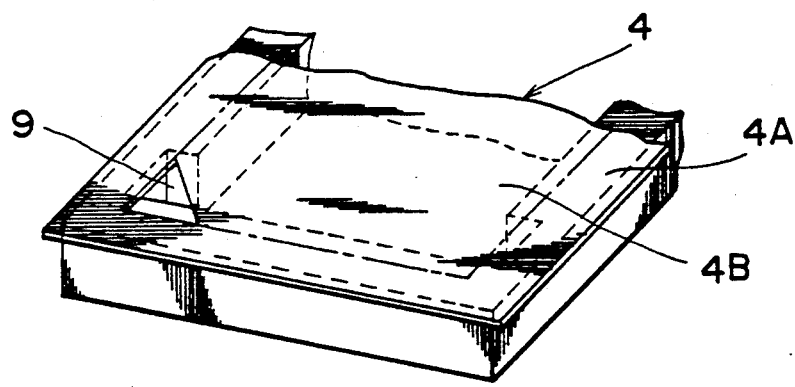
Figure 24:
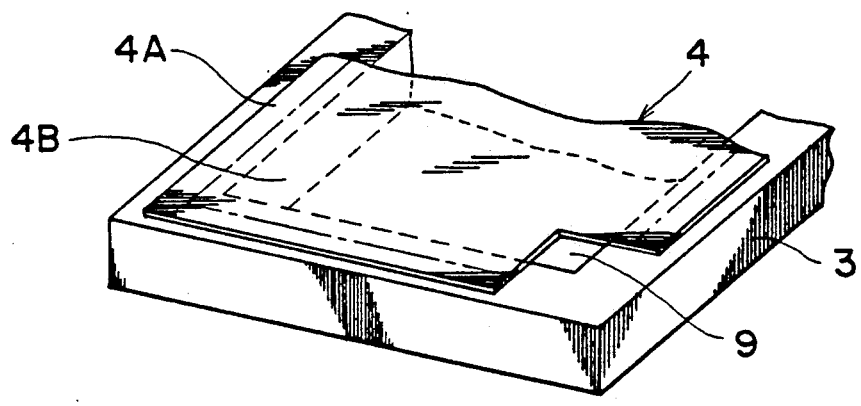

FIGS. 22, 23 and 24 show a protective sheet or an opening protection sheet 4 with a cut or hole 9 provided therein. This cut 9 is helpful in removing from a packing case 3 a protective sheet or an opening protection sheet 4 having separating means such as perforations or the like. In a protective sheet or opening protection sheet 4 formed with separating means such as perforations along single-dotted lines for separating a sheet peeling portion 4B from a sheet fixing portion 4A as shown in FIG. 22, a cut in the form of an ellipse 9 is provided. This hole or cut, however, may have various forms such as a triangle as shown in FIG. 23, a square as shown in FIG. 24, etc. It is no double that this type of cut may also be provided in a protection sheet or an opening protection sheet such as shown in FIG. 1, FIG. 2, FIG. 13 or FIG. 15A which is not provided with separating means such as perforations or the like.

Double Feed Preventing Members

In order to prevent double feeding of two or more image-recording sheets 1, a packing case is provided with double feed preventing members 2 such as shown in FIG. 2. It is likely that several image recording sheets immediately under the topmost image-recording sheet stored in a packing case are raised together with the topmost image-recording sheet when it is sucked up by the suckers at feeding due to the vacuum attraction acting between the image-recording sheets. When the topmost image-recording sheet 1 is raised higher than the double feed preventing members 2, the two sides of the topmost image-recording sheet warp or flex downward, and the sides of the image-recording sheets 1 sticking to the topmost image-recording sheet 1 are also warped or flexed. When the topmost image-recording sheet lifted up by the sucking force of the suckers is further raised to a certain level, the sides of the topmost image-recording sheet 1 come off the double feed preventing members 2 and flip back due to their own elasticity leaving the image recording sheet(s) which have been sticking to the topmost image recording sheet under the double feed preventing member 2, whereby the topmost image recording sheet 1 is separated from the other image recording sheet(s). The double feed preventing member is made of a thin elastic material, and it can be formed in various shapes. As shown in FIG. 2, double feed preventing members 2 may be tooth shape.

Figure 3:
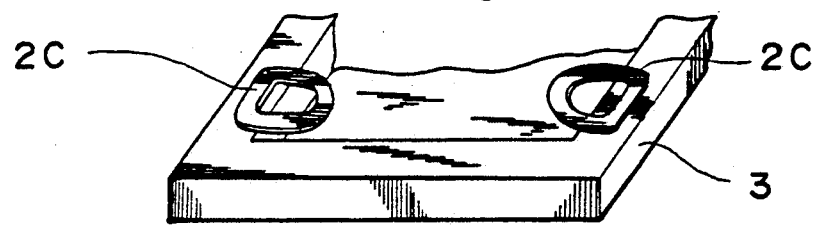
FIG. 3 to FIG. 6 are perspective view of packing cases with protective sheets and other embodiments of double feed preventing pawls of various different shapes.
Figure 4:
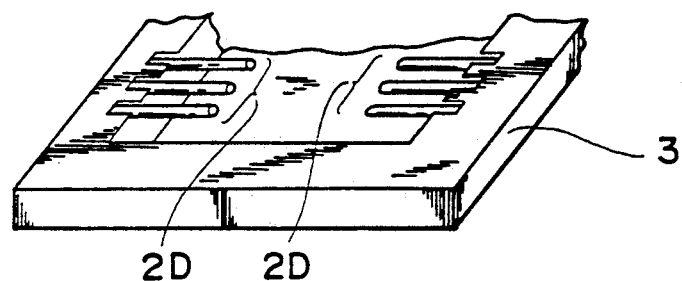
Figure 5:
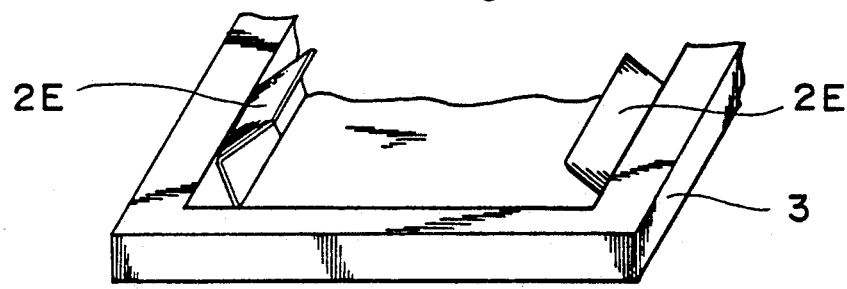
Figure 6:
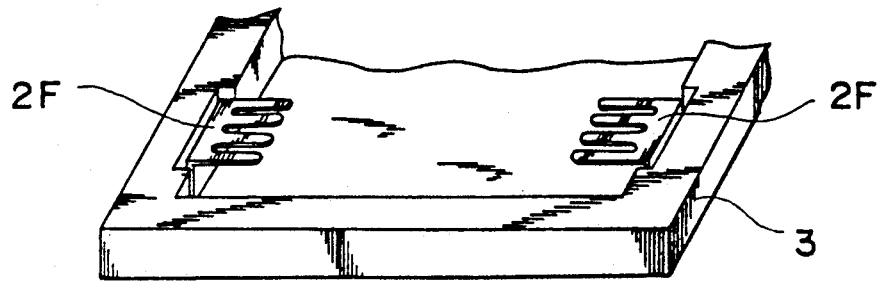

Another example of the double feed preventing members 2 is shown in FIG. 3. FIG. 3 shows the state in which ring-shaped double feed preventing members 2C are arranged on a packing case 3. As shown in FIG. 4, thin round rods made of an elastic material are arranged in grooves formed in a packing case 3, to constitute double feed preventing members 2D. The rods to be used as the double feed preventing members 2D may be rectangular, and the number of rods may be at least one to prevent the double feed of the image recording sheets 1. The double feed preventing members 2, 2C and 2D thus far exemplified are arranged on the upper surfaces of the packing cases 3, but the members for preventing the double feed may be disposed at the inside storage portion of the packing case for storing the image recording sheets 1. These examples are shown in FIGS. 5 and 6. FIG. 5 shows the state in which double feed preventing members 2E made of an elastic material such as a synthetic resin are arranged in the inside storage portion of a packing case 3E. FIG. 6 shows the state in which tooth- or comb-shaped double feed preventing members 2F are arranged in recesses formed in the inside storage portion of a packing case 3.

The foregoing double feed preventing member 2, 2C, 2D, 2E and 2F may take any shape that is effective to warp or flex when the image recording sheets in the packing case when the sheets are raised. It is no double that a packing case and double feed preventing means may also be formed in one piece. Moreover, the double feed preventing members 2, 2C, 2D, 2E and 2F may also be disposed at the feeding (front) side of a packing case.

Corner Recess

FIG. 25(A) to FIG. 25(D) are cross sections taken along a phantom line G as shown in FIG. 11, which successively explain the feeding operation of the image recording sheets 2 by the suckers 10. FIGS. 25(E) to FIG. 25(H) are perspective views showing a corner portion M of an image recording sheet 1 where a sucker 10 is sucking the image recording sheet 1.

Image-recording sheets 1 are stored in a storage area 22 formed in a packing case 3. Double-dotted lines shown in FIG. 11 shows an imaginary level of the stored image-recording sheets 1. The storage space 22 has four corners formed with semi-elliptical recesses 14. By these recesses at the corners of the storage space 22, the corners of an image-recording sheet do not touch the corners of the storage space 22, which greatly reduces the friction between the corners of the image recording sheet 1 and the corners of the storage space 22 when the image recording sheet 1 is raised by the sucker, whereby feeding is greatly facilitated.

Figure 25:
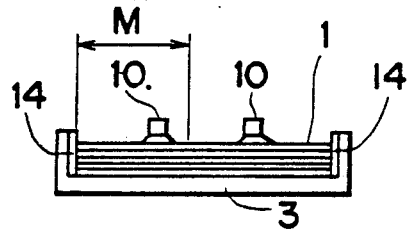
FIGS. 25A to 25H schematically successively illustrate the operation of feeding image recording sheets according to the present invention.
Figure 25:
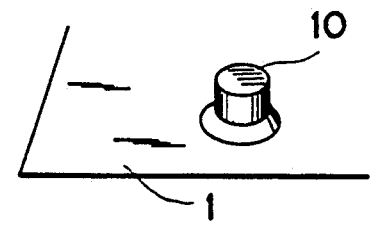
Figure 25:
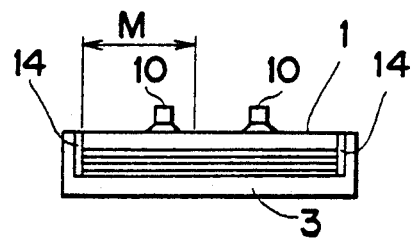
Figure 25:
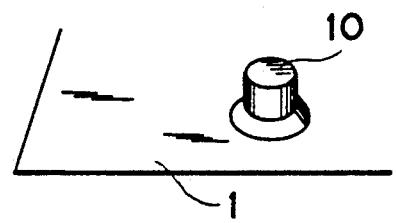
Figure 25:
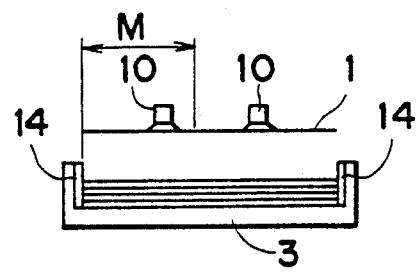
Figure 25:
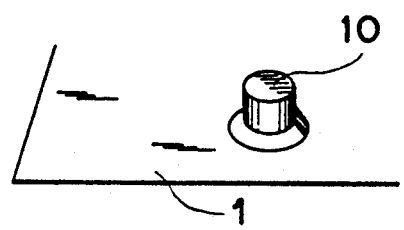
Figure 25:
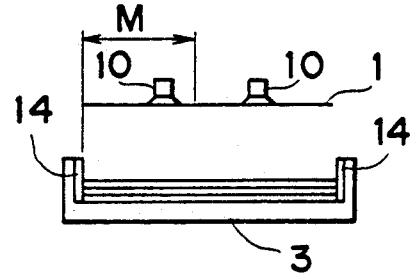
Figure 25:
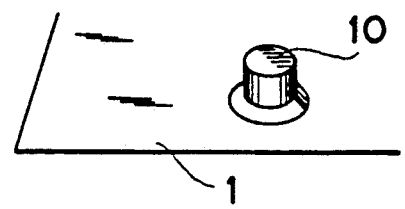

FIG. 25(A) shows the state in which the surface of the image recording sheet 1 stored in the packing case 3 is sucked by the two suckers 10 of the paper feed device (not shown). FIG. 25E is a perspective view showing the sucked state of the image recording sheet 1 by the suckers 10 within a range of its M portion shown in FIG. 25A. The end portion of the image recording sheet 1 has a reduced contact resistance to the packing case 3, particularly at its corners, because its contacting ratio with the packing case 3 is reduced by the elliptical recesses 14 formed in the storage space 22, as shown in FIGS. 25B and 25F. As a result, the end portion of the image recording sheet 1 is not caught by the packing case 3 but is raised together with the suckers 10. Even if the suckers 10 are further raised, the image recording sheet 1 is raised therewith out of the packing case 3, because the abovementioned resistance is weaker than the attraction of the image-recording sheet 1 by the suckers 10. These states are consecutively shown in FIGS. 25C, 25G, 25D and 25H.

The image recording sheet 1 carried out from the packing case 3 is fed to the inside of the image-recording apparatus by the not-shown paper feed device so that an image is produced thereon. In the paper feed device used for describing the present embodiment, the image-recording sheet 1 is raised by the suckers 10, and the suckers may be replaced by suction pumps or the like.

Figure 26:
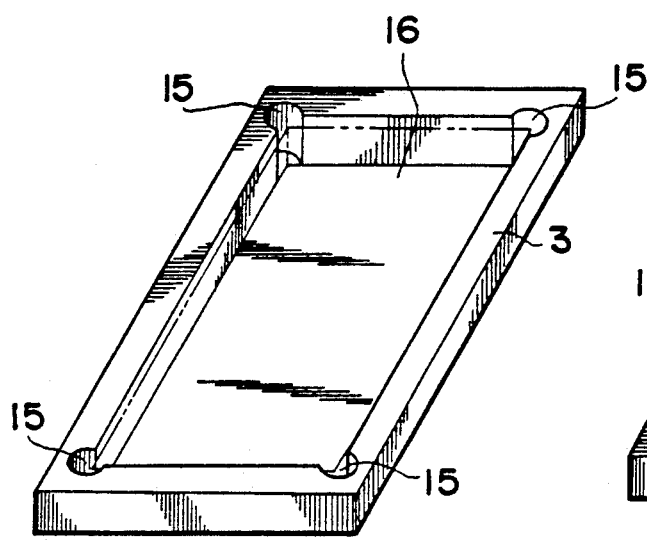
FIGS. 26 to 31 show various corner recesses provided in packing cases.

A packing case having corner recesses of another shape is perspectively shown in FIG. 26. A packing case 3 is formed with circular recesses 15 at four corners of an inside storage shape 16 for storing the image recording sheets 1. The state in which the image recording sheets 1 are stored in the inside storage shape 16 is shown by double-dotted lines. The circular recesses are formed in the corners of the inside storage shape 16 at the corners of the image recording sheet 1, so that the corners of the image recording sheet 1 and the packing case 3 will not make contact. As a result, the contact resistance between the image recording sheet 1 and the packing case 3 is weaker than the attraction of the suckers 10 of the paper feed device so that the image recording sheet 1 can be easily carried out from the packing case 3. A packing case having corner recesses of a still another shape is perspectively shown in FIG. 27. An inside storage shape 16 for storing the image recording sheets 1 is provided at its four sides with square projections 17.

Figure 27:
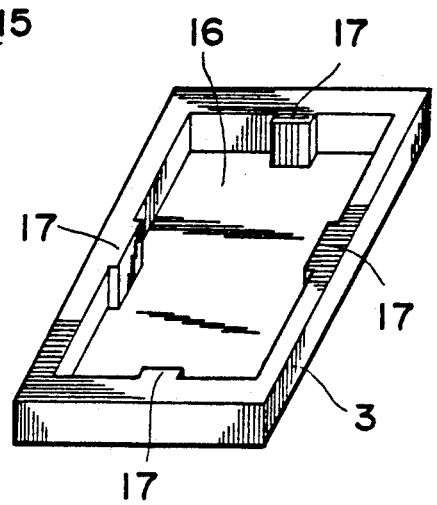

The aforementioned recesses are elliptical (14 as shown in FIG. 11) or circular (15 as shown in FIG. 26), but no problem will arise if the recesses are triangular, square or pentagonal. Moreover, the projections may be square (17 as shown in FIG. 27), but they may be curved into an elliptical or circular shape.

Figure 28:
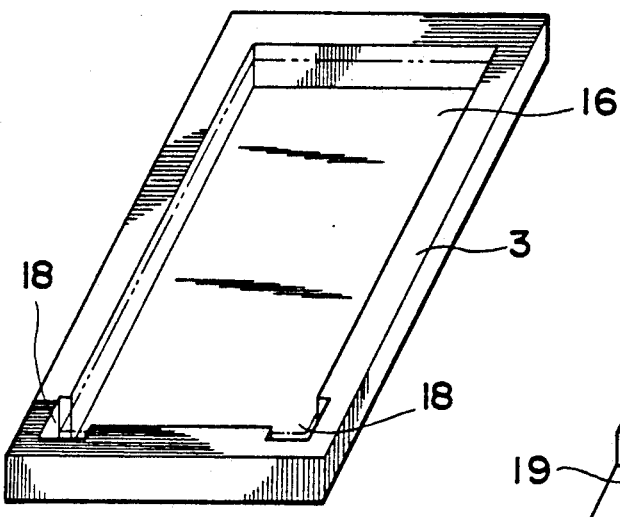

The inside storage shapes 6 and 16 so far described are shaped such that all the four corners of the image-recording sheet 2 are kept away from contact with the packing case 3. However, the inside storage shape may be made such that only the two corners of the image-recording sheet 1 to be pulled up by the paper feed device are kept away from contact with the packing case. For example, FIG. 28 is a perspective view showing a packing case having recesses only at its two corners. An inside storage shape 16 for storing the image recording sheet 1 is formed at its two corners with square recesses 18. Double-dotted lines shown in FIG. 28 indicate a top level of the image recording sheets stored in the inside storage space 16. Even if the square recesses 18 are formed only at the portions where the image recording sheet 1 is raised, no problem will arise in the paper feed. Further, the recesses 18 may be formed into circular ones without any problem.

Figure 29:
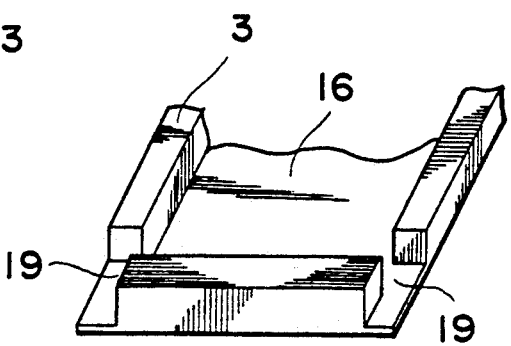

All the packing cases so far described have their four sides framed, but this frame may be notched at its corners to keep the corner of the image recording sheet 1 away from contact with the packing case. For example, FIG. 29 is a perspective view showing an essential portion of a packing case having its corners cut away. A packing case 3 is formed at its corners with notches 19 so that the corner portions of the image recording sheet 1 are kept away from contact with the packing case 3.

Figure 30:
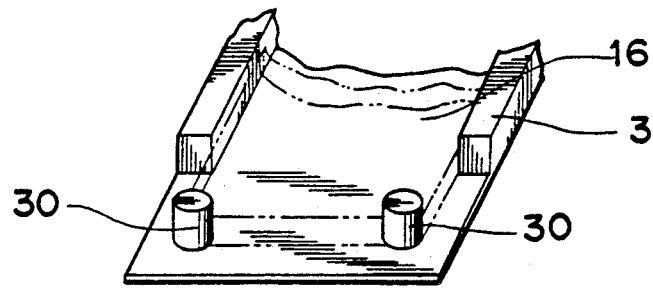

Moreover, the notches may be replaced by another structure in which the frame is partially removed from a packing case. For example, FIG. 30 is a perspective view showing an essential portion of a packing case having a structure in which a part (one side) of the frame is removed. The removed frame at one side thereof is replaced for two circular columns 30 which act to prevent the image-recording sheet 2 from coming out from the opening (i.e., the unframed side) of the packing case 3. The state in which the image-recording sheet 1 is accommodated in an inside storage shape 16 is indicated by double-dotted lines. Thus, a wide non-contact portion is established between the end portion of the image-recording sheet 1 and the packing case 3 so that the operation of the paper feed device are facilitated. On the other hand, the circular columns 30 should not be limited to two, and they may take any shape such as square columns, triangular columns elliptical columns, etc.

Figure 31:
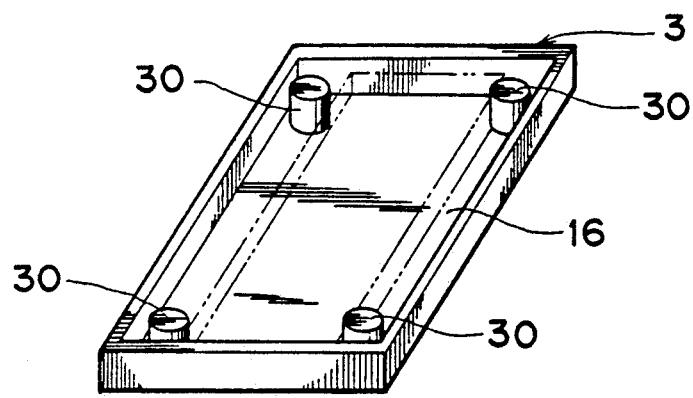

Further, FIG. 31 is a perspective view showing a packing case having four columns at its four corners. A packing case 3 has its four side frames removed and at the corners of which are arranged circular columns 30 to define an inside storage shape 16. The image-recording sheet 1 is accommodated, as indicated by double-dotted lines, in the inside storage shape 16 of the packing case 3 such that it is held between the circular columns 30.

The shape of the image-recording sheet so far described is rectangular, but similar effects can be achieved, even in the case of square or another shape, by using a packing case which has the aforementioned inside storage shape. Moreover, by combining the packing cases and the inside storage shapes according to the above embodiments, the non-contact between the end portion of the image recording sheet and the packing case can apparently be further improved.

Sheet Size Detection

Figure 36:
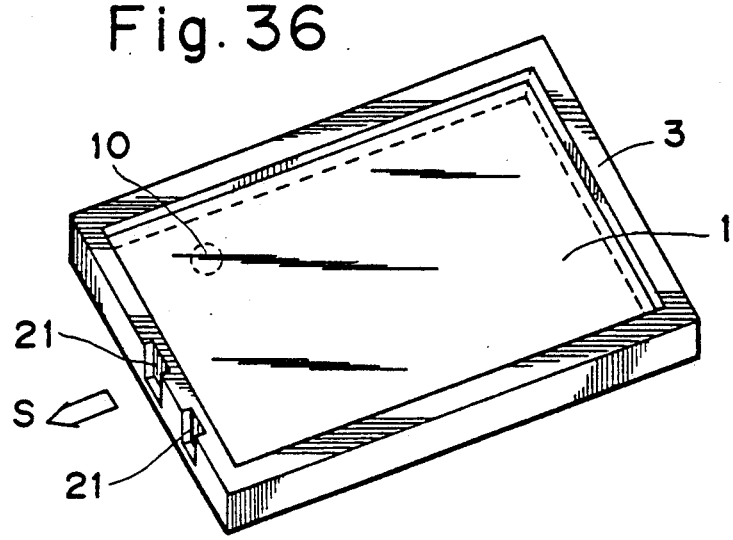
FIG. 36 is a perspective view of a packing case having size recognition recesses of a first type.

FIG. 36 is a perspective view showing a packing case 3 provided with sheet size discriminating recesses 21 of a first type. Image recording sheets 1 can not be transported or handled by the operator's hands unlike ordinary paper because their surfaces are coated with image forming agent. Therefore, the image recording sheets are packed in an image recording sheet packing case 3. Thus, the image recording sheets 1 can be protected from having their surfaces damaged and their printed image deteriorated. The image recording sheet packing case 3 is provided with sheet size discriminating recesses 21 at one side frame thereof. A sheet size is discriminated from the number and position of the sheet size discriminating recesses 21. In this embodiment, the sheet packing case 3 is formed into such a configuration that it can be directly mounted in an image-recording apparatus.

Figure 32:
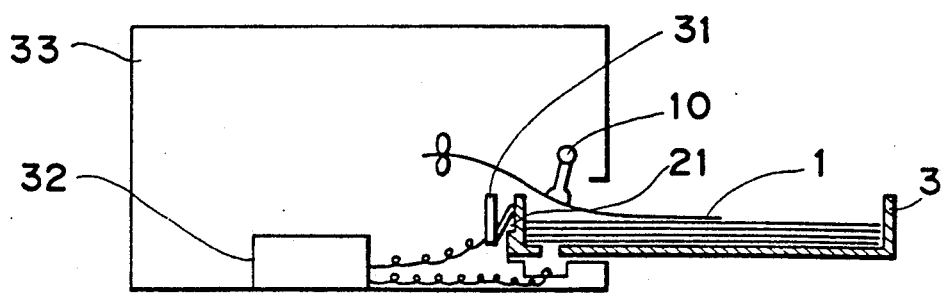
FIG. 32 is a schematic cross section of a feeding mechanism accommodating a packing case therein.

FIG. 32 is a schematic section showing an image recording sheet packing case 3 which is mounted in an image-recording apparatus 33. The image recording sheet packing case 3 is mounted directly in the image-recording apparatus 33 by means of an unshown holding mechanism. The image-recording apparatus 33 is arranged with a non-contact type detectors 31 in positions corresponding to the sheet size discriminating recesses 21 at the side of the image recording sheet packing case 3. The detectors 31 are connected with a size discrimination until 32.

Next, the operations will be described in the following. The sheet size discriminating recesses 21 of the image recording sheet packing case 3 take different numbers and positions depending upon the sheet sizes so that the signals detected by the detectors 31 are sent to the size discrimination unit 32 of the image recording sheets 1 to discriminate the sheet sizes. The image recording sheets 1 are fed to the inside of the image recording apparatus 33 by a paper feed unit 10 so that the size discrimination unit 32 operates the image recording apparatus 33 in accordance with the sheet sizes.

Figures 33, 34:
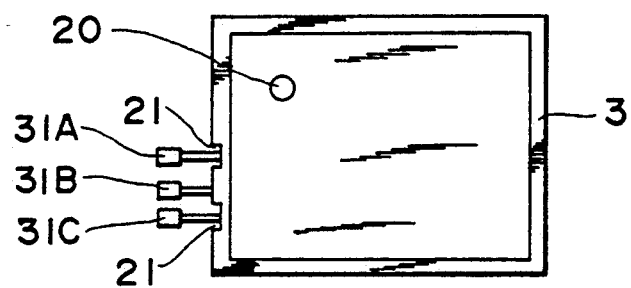
FIG. 33 is a plan view of the packing case having size recognition recesses shown in FIG. 32.
FIG. 34 shows relations between recess combinations and sheet sizes.

Next, the sheet size detection units 5 will be described in detail in the following. FIG. 33 is a schematic top plan view showing the image recording sheet packing case 3 and the contact detectors 31. When the image recording sheet packing case 3 is mounted in the image-recording apparatus 33, detectors 31A and 31C corresponding to the recesses of the sheet size discriminating recesses 21 are turned OFF whereas the detector 31B corresponding to the flat portion is turned ON. The detectors 31 discriminate the differences of the various sheet sizes by changing the combination of the sheet size discriminating recesses 21 of the image recording sheet packing case 3. The pattern for discriminating the sheet sizes by combining the ON and OFF of the detectors 31A, 31B and 31C is schematically enumerated in FIG. 34. In FIG. 34, circles indicate the ON states of the detectors 31A, 31B and 31C, and symbols X indicate the OFF states of the same. If the detector 31A is ON whereas the detectors 31B and 31C are OFF, for example, it is determined that the sheet size is A3. Further, for example, if the detectors 31A and 31C are OFF whereas the detector 31B is ON, it is determined that the sheet size at this time is A4. In the present embodiment, three detectors 31A, 31B and 31C are used, and therefore as many as eight kinds of sheet sizes can be discriminated. If only two detectors are used, four kinds of sheet sizes can be discriminated. Thus, the more detectors enable the more sheet size discrimination.

Figure 35:
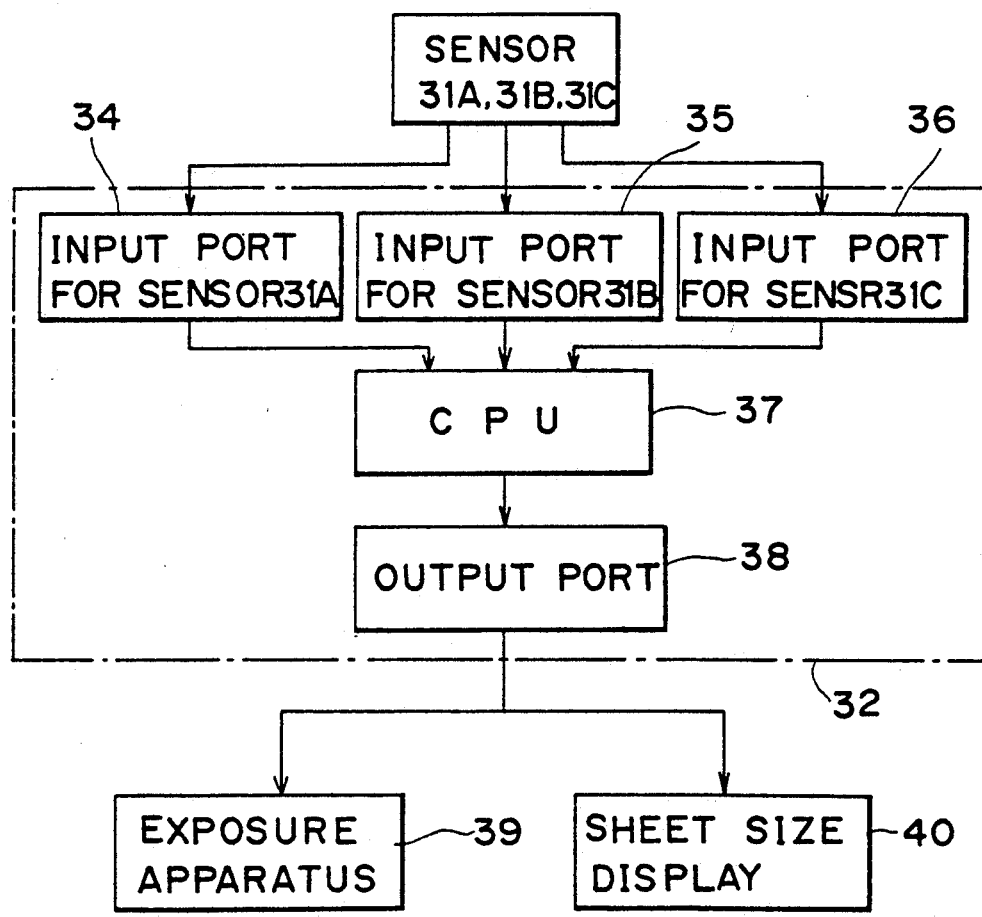
FIG. 35 is a schematic operation diagram of a sheet size recognition unit.

FIG. 35 is a schematic block diagram showing the operating procedures of the size discrimination unit 32 for the image recording sheets 1, which is used in the embodiment shown in FIG. 36. The signals detected by the detectors 31A, 31B and 31C are fed to input ports 34, 35 and 36 in the size discrimination unit 32. The signals are further fed from the individual input ports to a CPU 37 which is stored with data of the sheet sizes, to discriminate the image recording sheets 1 set in the image-recording apparatus 33. Next, the discriminated data are fed from an output port 38 to an exposure apparatus 39 to make the image recording operations possible and further to a sheet size display 40 to display the sheet size.

Figure 38:
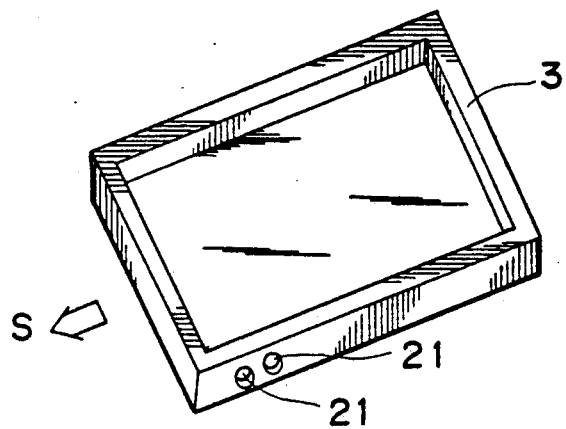
FIG. 38 is a perspective view of a packing case having size recognition recesses of a third type.

FIG. 38 is a perspective view showing an image recording sheet packing case provided with sheet size discriminating recesses 21 of a second type. As shown in the figure, the image recording sheet packing case 3 is formed in its side frame with circular sheet size discriminating recesses 21.

Figure 39:
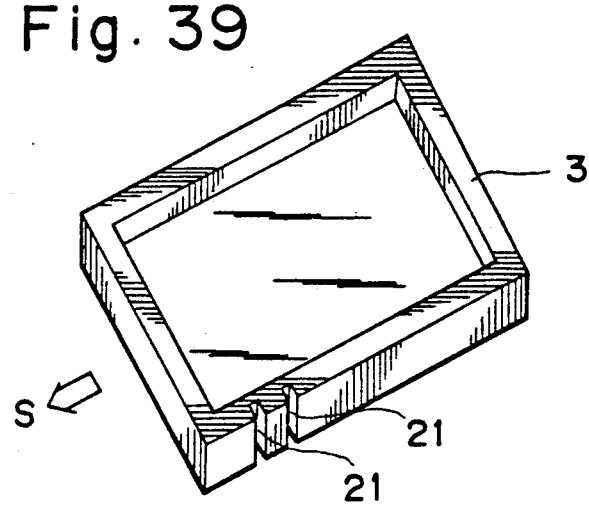
FIG. 39 is a perspective view of a packing case having size recognition recesses of a fourth type.

FIG. 39 is a perspective view showing an image-recording sheet packing case having sheet size discriminating recesses of a third type. The image-recording sheet packing case 3 is formed in its side with notched sheet size discriminating shapes 21.

Figure 37:
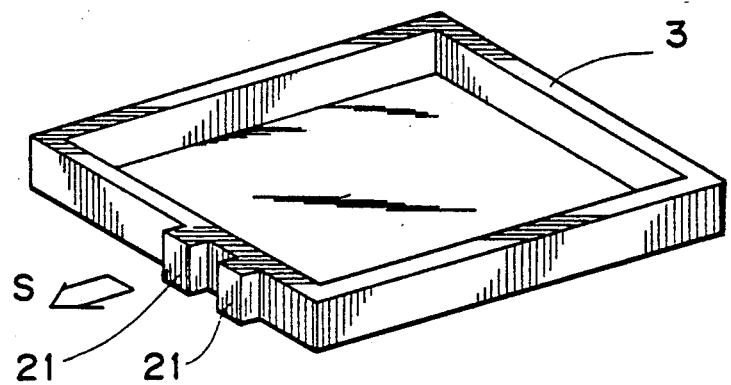
FIG. 37 is a perspective view of a packing case having size recognition recesses of a second type.

FIG. 37 is a perspective view showing an image-recording sheet packing case having sheet size discriminating blocks of a fourth type. As shown, image recording sheet packing case 3 is formed in its side with protruding sheet size discriminating shapes 21.

No problem would arise even if the sheet size discriminating shapes might be polygonal or elliptical. Moreover, the shapes may be cut hollow, recessed or protruded.

Figures 40A, 40B:
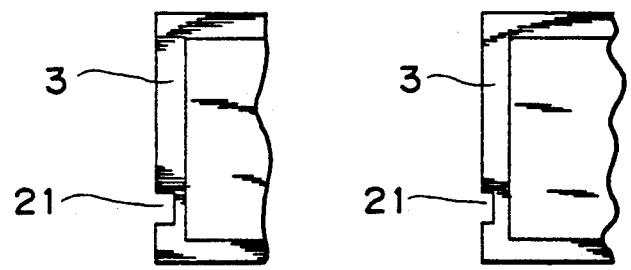
FIGS. 40A and 40B are segmentary view showing recesses of different depths provided in packing cases.

FIGS. 40A and 40B are partial, schematic top plan views showing other types of sheet size discriminating shapes of the present invention. The image recording sheet packing cases 3 are provided therein with recesses having depths different according to the sheet sizes. The sheet size discrimination shape 21 shown in FIG. 40A is deeper than that of the sheet size discriminating shape 21 as shown in FIG. 40B.

Figure 41:
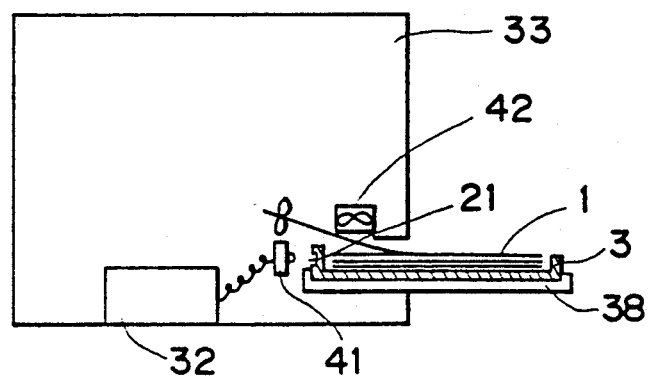
FIG. 41 is a schematic view of a feeding mechanism accommodating the packing case shown in FIGS. 40A or 40B.

FIG. 41 is a schematic cross section showing the image recording sheet packing case mounted in the image-recording apparatus. This image-recording apparatus 33 is arranged at its paper receiving portion with a case bed 38 holding an image recording sheet packing case 3 accommodating image recording sheets 1. Incidentally, the case bed 38 is shaped to surround the image recording sheet packing case 3 thereby to hold the image recording sheet packing case 3 in an immovable manner. In a position of the image recording apparatus 33 corresponding to the sheet size discriminating shapes 21 of the image recording sheet packing case 3, there is provided a non-contact type detector 41 such as an ultrasonic transmitter or microphone for measuring the depth of the sheet size discriminating shapes 21. Next, the operation will be described in the following. When the image recording sheet packing case 3 containing the image recording sheets 1 is mounted on the bed 38, the detector 41 detects the depth of the recesses of the sheet size discriminating shapes 21 so that its signal is sent to the size discrimination unit 32 to discriminate the sheet size. The operating procedure of the size discrimination unit 32 is similar to that shown in FIG. 35 except for the detector 41, and therefore its explanation is omitted here. The image recording sheets 1 are sucked by a suction unit 42 and conveyed to the inside of the image-recording apparatus 33 by a feeding mechananism (not shown). Although the non-contact detector 41 is used for measuring the depth of the sheet size discriminating shapes 31 in the present embodiment, a mechanical contact detector can also be used. For example, a detector using a linear potentiometer or link means can be used to produce signals corresponding to the depth of the sheet size discriminating shapes 21 formed in the image recording sheet packing case 3.

Image-Recording Sheet Exhaustion Detection

In this embodiment, as shown in FIG. 11, an image recording sheet packing case 3 is formed in its bottom with a circular recognition hole 20 for recognizing the existence or presence of image recording sheets 1. When the image recording sheets 1 remain in the packing case 3, the recognition hole 20 is covered by the remaining image recording sheets 1. On the other hand, it is open when the image recording sheets 1 are exhausted.

FIG. 42 is a schematic view showing the image recording sheet packing case 3 of FIG. 11 mounted in an image recording apparatus 33. The image recording sheet packing case 3 is mounted in the image recording apparatus 33 by means of a not-shown holding mechanism. In the image recording apparatus 33, there is fixed a reflection type exhaustion sensor 44 which is positioned to correspond to the aforementioned recognition hole 20 in the bottom of the image recording sheet packing case 3 and made of a reflection type photo sensor. The reflection type exhaustion sensor 44 is connected with an exhaustion discrimination unit 45 for the image recording sheets 1.

Next, the operations will be described in the following. While the image recording sheets 1 are present, the recognition hole 20 is shielded by the image recording sheets 1 so that a signal detected by the exhaustion sensor 44 is sent to the exhaustion discrimination unit 45 to determine that the image recording sheets 1 are present. After the presence of the image recording sheets 1 has been confirmed by the exhaustion discrimination unit 45, the image recording apparatus 33 is ordinarily operated to feed out the image recording sheets 1 to the inside of the image recording apparatus 33 by the action of a roller 46 of the paper feed unit. When the image recording sheets 1 are exhausted, the recognition hole 20 is opened so that the exhaustion sensor 44 sends a signal indicating the exhaustion of the image recording sheets 1 to the exhaustion discrimination unit 45. Then, this unit 45 sends a signal to an operating mechanism of the image recording apparatus 33 to stop its operations.

FIG. 44 is a schematic diagram showing the operating procedure of the exhaustion discrimination unit 45 for the image-recording sheets 1 used in FIG. 42. The signal detected by the sensor 44 is sent to an input port 49 in the exhaustion discrimination unit 45. Then, the data from the input port is sent to a CPU 37 stored with operation data indicating the existence of the image recording sheets 1, to discriminate the existence of the image recording sheets 1 in the image recording sheet packing case 3 set in the image recording apparatus 33. Next the discrimination data is sent from an output port 50 to an exposure apparatus 39 to keep the image recording operation possible during the presence of image recording sheets, and it will turn the same impossible in the absence of image recording sheets. The discrimination data is further sent to a remaining paper display 51 so that the presence or absence of the image-recording sheets 1 is displayed in the display panel.

FIG. 42 shows an embodiment using a reflection type photo sensor, and FIG. 43 shows the embodiment using an interrupter type photo sensor 47 and 48. In the latter case, a light receiving sensor 48 is positioned above the recognition hole 20. The operation of discriminating exhaustion of the image-recording sheets 1 is identical to that of FIG. 42, and will therefore be omitted here.

FIG. 45 is an enlarged section showing another image recording sheet recognition hole. A transparent film 52 such as cellophane is adhered to a recognition hole 20 for recognizing the image recording sheets 1 so that these sheets 1 may be prevented from being blotted from the outside of an image recording sheet packing case 3. By the use of the transparent film 52, it is possible to use the reflection or transmission type photo sensor like the aforementioned embodiment. On the other hand, the film 52 may be disposed for similar effects on the outer side of the image recording sheet packing case 3. Alternatively, the face of the image recording sheet packing case 3, at which the image recording sheets 1 come into contact, can be made of a transparent member.

Figure 48:
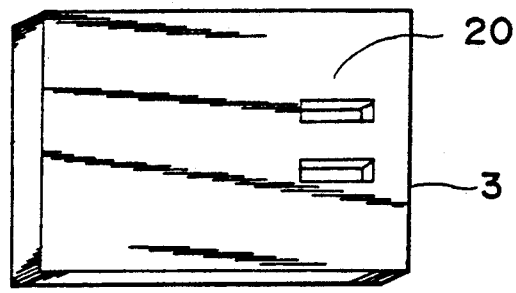
FIG. 48 is a perspective view of the back side of a packing case having sheet and sheet size recognition holes.
Figure 49A:
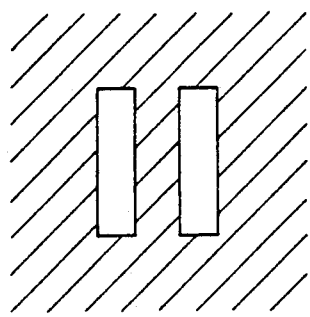
FIGS. 49A to 49D show variations of sheet and sheet size recognition holes.
Figure 49C:
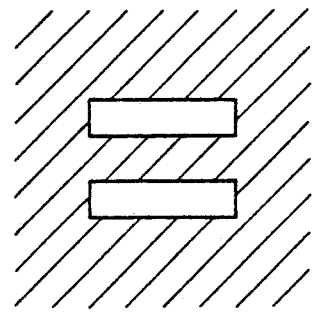
Figure 49B:
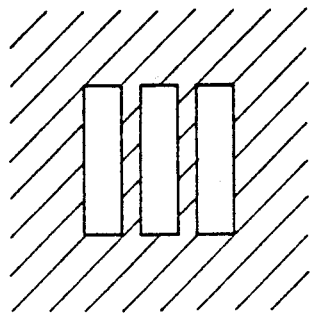
Figure 49D:
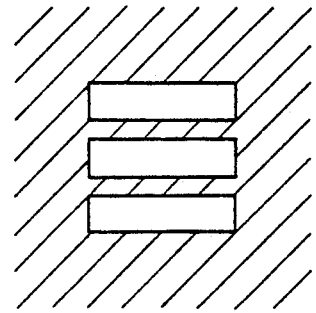
Figure 50:
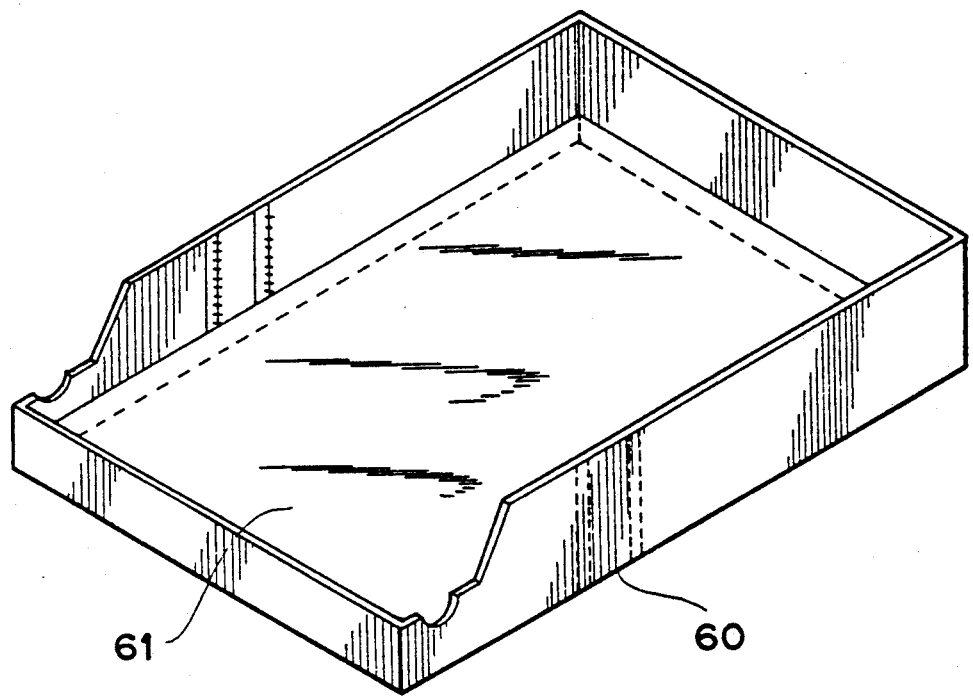
FIG. 50 is a perspective view of a conventional feeding tray.
Figure 52:
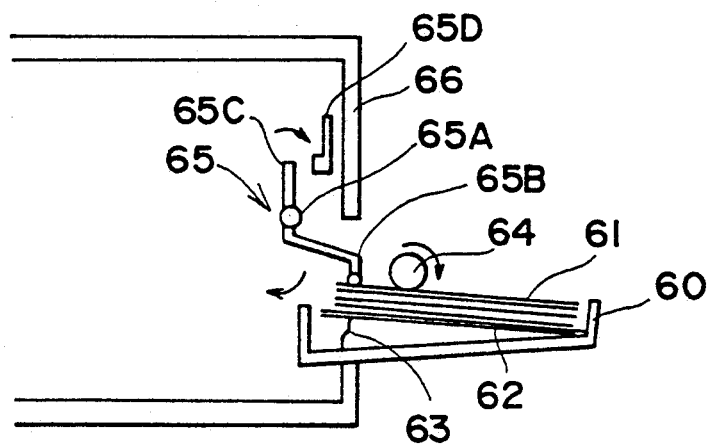
FIG. 52 schematically shows a feeding mechanism of the prior art.

In the embodiment shown in FIG. 45, not only the size of the sheets can be automatically recognized, but also what size is set in the image recording apparatus can be recognized by changing the cellophane colors for the individual sheet sizes and by providing individual color recognition sensors. Another means for recognizing the sheet sizes is shown in FIG. 48. FIG. 48 is a perspective view showing the back of an image recording sheet packing case 3. This packing case 3 is blackened at its back. Discriminating shapes 20 are schematically shown in FIGS. 49A to 49D. The discriminating shapes are shown in FIG. 49A, FIG. 49B, FIG. 49C and FIG. 49D correspond to image-recording sheet sizes, e.g., A4, A3, B4 and B5 respectively. The sizes of the image recording sheets 1 can be determined by arranging the sensor provided below the discriminating shapes 20 to recognize the discriminating shapes 20 by reflections or the like. Since no reflection comes from the image recording sheets 1 in the absence of the sheets 1, it is determined that the image recording sheet 1 are exhausted. Since the paper is usually white, the discrimination power is improved by coloring the discriminating shapes 20 in black or other dark colors. It should be noted that the discriminating shapes 20 may take any shapes if they are different for the different sizes. It is apparent that only an area around the discrimination shapes may be colored in black for obtaining the same result. As will be described hereunder, the presence and sizes of the sheets can be recognized with the single recognition hole. It should also be noted that, the recognition hole 20 is circular in the embodiment as shown above, but will raise no problem even if it is polygonal or elliptical. The existence of the image recording sheets 1 can naturally be detected even if the image recording sheet packing case 3 has its side formed with a similar recognition hole or notch, as will be described in the following.

As shown in FIG. 46A, an image recording sheet packing case 3 has its side formed partially in its lower portion with a recognition hole 20 for the image recording sheets 1. A touch sensor 53 made of a micro-switch or the like is fixed on the not-shown paper feed unit of the image recording apparatus. If the image recording sheet packing case 3 is mounted in the image recording apparatus, as will be more specifically shown in FIGS. 46B and 46C, the touch sensor 53 disposed in the image recording apparatus is brought to the position of the recognition hole 20 of the image recording sheet packing case 20 by a not-shown mechanism. FIG. 46B shows the case in which the image recording sheets 1 are present so that the touch sensor 53 is turned OFF, for example, by the weight of the image recording sheet 1. FIG. 46C shows the case in which the image recording sheets 1 are exhausted so that the touch sensor 53 is turned ON, for example. Here, the touch sensor 53 is equipped at one end of a leaf spring 53A with a projection 53B, which comes into contact with the lower side of the image recording sheets 1. The other end of the leaf spring 53A is connected with a switch 53C which is turned ON and OFF in accordance with the vertical motions of the leaf spring 53A to discriminate the presence and absence of the image recording sheets 1.

The image recording sheet packing case 3 used in the above embodiment lacks one of its four sides. However, it may have all its four sides framed. Further, in the above embodiment, the image recording sheet packing case 3 is so made that it can be directly set in the image recording apparatus. However, a packing case containing the image recording sheets may be mounted on a packing case try which is attached to the image recording apparatus. This embodiment is shown in a schematic section in FIG. 47. At the paper receiving portion of an image recording apparatus 33, there is arranged a packing case tray 9, on which is mounted an image recording sheet packing case 3 accommodating the image recording sheets 1. The packing case tray 54 is placed over an exhaustion sensor 44 which is made of a reflection type photo sensor for detecting the existence of the image recording sheets 1. In case the image recording sheets 1 are present, they are sucked up by a suction unit 42 and are conveyed to the inside of the image-recording apparatus by the action of not-shown means.

The image recording sheets used in the present embodiment have their surfaces coated with the image forming substances, but even ordinary paper having no coating of the image-forming material will not raise any problem. Moreover, although the protective sheets, peeling aids provided in protective sheets, double feed preventing members, corner recesses provided in packing cases, sheet size recognition means, and sheet exhaustion discriminating means have been described separately in the foregoing paragraphs, it is no doubt that they may be combined to realize an image recording sheet packing case which provides an optimum feeding characteristics for a given feeding mechanism of a image recording apparatus.

What is claimed is:

1. A packing case for accommodating image recording sheets used in an image recording apparatus, the packing case comprising:

sides and a bottom defining a space within the packing case for accommodating image recording sheets;

means defining corner recesses in the packing case for avoiding direct contact of the corners of the packing case with the corners of the image recording sheets accommodated in the space; and a removable protective sheet removably attached to the packing case for covering image recording sheets accommodated in the space for protecting the image recording sheets.

2. A packing case for accommodating image recording sheets used in an image recording apparatus defined in claim 1, further comprising image recording sheets accommodated in said space.

3. A packing case for accommodating image recording sheets used in an image recording apparatus defined in claim 2, wherein said image recording sheets are each composed of a substrate, and an image forming agent coated on said substrate and which is reactive with a photosensitive material.

4. A packing case for accommodating image recording sheets used in an image recording apparatus defined in claim 1, further comprising a top cover covering a part of said space.

5. A packing case for accommodating image recording sheets used in an image recording apparatus defined in claim 1, further comprising means for preventing double feeding of image recording sheets.

6. A packing case for accommodating image recording sheets used in an image recording apparatus defined in claim 1, further comprising discriminating means for discriminating the size of an image recording sheet.

7. A packing case for accommodating image recording sheets used in an image recording apparatus defined in claim 1, further comprising recognition means for recognizing the exhaustion or the presence of image recording sheets.

8. A packing case for accommodating image recording sheets used in an image recording apparatus defined in claim 1, wherein the protective sheet has peeling aid means provided at at least a part of the protective sheet to aid in peeling the protective sheet off the packing case.

* * * * *